(12) United States Patent
Chen et al.

(10) Patent No.: US 11,575,259 B2
(45) Date of Patent: Feb. 7, 2023

(54) INTERFACE CIRCUIT WITH ROBUST ELECTROSTATIC DISCHARGE

(71) Applicant: QUALCOMM Incorporated, San Diego, CA (US)

(72) Inventors: Wen-Yi Chen, Folsom, CA (US); Reza Jalilizeinali, San Marcos, CA (US); Sreeker Dundigal, San Diego, CA (US); Krishna Chaitanya Chillara, Del Mar, CA (US); Gregory Lynch, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/370,894

(22) Filed: Jul. 8, 2021

(65) Prior Publication Data
US 2023/0008489 A1 Jan. 12, 2023

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01)

(58) Field of Classification Search
CPC .............................. H02H 9/046; H01L 27/0255
USPC ........................................................ 361/56
See application file for complete search history.

(56) References Cited

U.S. PATENT DOCUMENTS

| 5,814,865 A | 9/1998 | Duvvury et al. |
| 6,045,209 A | 4/2000 | Imai |
| 6,118,301 A | 9/2000 | Singh et al. |
| 6,465,768 B1 | 10/2002 | Ker et al. |

(Continued)

FOREIGN PATENT DOCUMENTS

| EP | 0840453 A2 | 5/1998 |
| JP | 2003031672 A | 1/2003 |

(Continued)

OTHER PUBLICATIONS

International Search Report and Writtenn Opinion—PCT/US2022/032388—ISA/EPO—dated Oct. 10, 2022.

*Primary Examiner* — Dharti H Patel
(74) *Attorney, Agent, or Firm* — Loza & Loza, LLP

(57) ABSTRACT

An ESD protection circuit has a driver transistor with a drain that is coupled to an I/O pad of an IC device and a source that is coupled to a first rail of a power supply in the IC device, and a diode that couples the I/O pad to the first rail and that is configured to be reverse-biased when a rated voltage is applied to the I/O pad. The rated voltage lies within a nominal operating range for voltage levels defined for the input/output pad. The ESD protection circuit has a gate pull transistor that couples a gate of the driver transistor to the I/O pad or the first rail. The gate pull transistor may be configured to present a high impedance path between the gate of the driver transistor and the I/O pad or the first rail when the rated voltage is applied to the I/O pad. The gate pull transistor may be configured to provide a low impedance path between the gate of the driver transistor and the I/O pad or the first rail when an overvoltage signal applied to the I/O pad has a magnitude that exceeds the nominal operating range of voltage levels defined for the I/O pad.

33 Claims, 16 Drawing Sheets

(56) References Cited

U.S. PATENT DOCUMENTS

| | | | |
|---|---|---|---|
| 6,760,209 B1 * | 7/2004 | Sharpe-Geisler | H01L 27/0259 |
| | | | 361/111 |
| 7,580,233 B2 | 8/2009 | Davis | |
| 7,764,475 B2 | 7/2010 | Sung et al. | |
| 3,072,720 A1 | 12/2011 | Okushima | |
| 8,189,308 B2 | 5/2012 | Lim | |
| 8,228,651 B2 * | 7/2012 | Kim | H01L 27/0266 |
| | | | 361/56 |
| 8,730,625 B2 | 5/2014 | Stockinger | |
| 10,134,725 B2 | 11/2018 | Lee | |
| 2006/0066355 A1 * | 3/2006 | Gosmain | H03K 19/00315 |
| | | | 326/87 |
| 2007/0177317 A1 * | 8/2007 | Kim | H01L 27/0266 |
| | | | 361/56 |
| 2010/0165524 A1 * | 7/2010 | Lim | H01L 27/0292 |
| | | | 361/56 |
| 2011/0026176 A1 * | 2/2011 | Kim | H01L 27/0266 |
| | | | 361/56 |
| 2011/0180874 A1 | 7/2011 | Okushima | |
| 2018/0006448 A1 * | 1/2018 | Glaser | H02H 9/046 |
| 2019/0326751 A1 | 10/2019 | Xi | |

FOREIGN PATENT DOCUMENTS

| | | |
|---|---|---|
| KR | 101145791 B1 | 5/2012 |
| WO | 03005523 A2 | 1/2003 |

\* cited by examiner

NMOS Drivers, NMOS Gate-Pull to $V_{DD}$

FIG. 14

INTERFACE CIRCUIT WITH ROBUST ELECTROSTATIC DISCHARGE

TECHNICAL FIELD

The present disclosure generally relates to interface circuits for integrated circuits and, more particularly, to electrostatic discharge protection circuits that can enhance charged-device model robustness of integrated circuit devices.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Continuous service enhancements require the advancement of process technologies that can provide integrated circuit (IC) devices with ever increasing performance and transistor densities.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 kVolt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

Changes in certain aspects of large scale IC designs and semiconductor manufacturing processes, including reductions in process minimum feature size can create new or different susceptibilities of IC devices to ESD events. Accordingly, there is an ongoing need for improvements in ESD protection for IC interface circuits.

SUMMARY

Certain aspects of the disclosure relate to systems, apparatus, methods and techniques that can provide enhanced ESD protection circuits in certain IC devices, including IC devices that employ multiple voltage domains. Some examples disclosed herein are applicable to interface circuits in an IC. Some examples disclosed herein are applicable to the protection of circuits at the boundary between a low-voltage domain that is used to implement certain core features of the IC device and a higher-voltage domain that is used for device input and output (I/O).

In one aspect of the disclosure, an ESD protection circuit includes a driver transistor having a drain that is coupled to an I/O pad of an IC device and a source that is coupled to a rail of a first power supply in the IC device; an ESD protection diode that couples the I/O pad to the rail of the first power supply; and a gate pull transistor that couples a gate of the driver transistor to the I/O pad or to the rail of the first power supply.

In one aspect of the disclosure, an apparatus has means for driving an I/O pad of an IC device, the means for driving the I/O pad including a driver transistor coupled by its source to a rail of a first power supply in the IC device; means for diverting an electrostatic discharge current received at the I/O pad to the rail of the first power supply during an ESD event; and means for pulling a gate of the driver transistor to a voltage level of the I/O pad or to the rail of the first power supply during the ESD event, the means for pulling the gate of the driver transistor comprising a gate pull transistor coupled between the gate of the driver transistor and the I/O pad or the rail of the first power supply.

In one aspect of the disclosure, a method for providing ESD protection in an IC device includes coupling a drain of a driver transistor to an I/O pad of the IC device; coupling a source of the driver transistor to a rail of a first power supply in the IC device; using an ESD protection diode to couple the I/O pad and the rail of the first power supply; and using a gate pull transistor to couple a gate of the driver transistor and the I/O pad or the rail of the first power supply.

In certain examples, the source of the driver transistor is coupled to the rail of the first power supply through at least one other transistor. The gate of the driver transistor may be configured to receive an input signal provided by a pre-driver circuit powered by a second power supply.

In some examples, a clamp circuit coupled between the rail of the first power supply and a ground reference rail of the first power supply. The clamp circuit provides a control signal to a gate of the gate pull transistor.

In some examples, the gate pull transistor is a P-type metal-oxide-semiconductor transistor that is configured to couple the gate of the driver transistor to the rail of the first power supply. The gate of the gate pull transistor may be coupled to a rail of a second power supply.

In some examples, the gate pull transistor is a P-type metal-oxide-semiconductor transistor. In one example, the gate pull transistor is configured to couple the gate of the driver transistor to the rail of the first power supply, and the gate of the gate pull transistor may be coupled to a rail of a second power supply. In another example, the gate pull transistor is configured to couple the gate of the driver transistor to the I/O pad, and the gate of the gate pull transistor may be coupled to the rail of the first power supply or to a rail of a second power supply.

In some examples, the gate pull transistor is an N-type metal-oxide-semiconductor transistor. The driver transistor may be a P-type metal-oxide-semiconductor transistor or an N-type metal-oxide-semiconductor transistor.

In some examples, the gate pull transistor is configured to provide a low impedance path between the gate of the driver transistor and the I/O pad or the rail of the first power supply during an ESD event.

In some examples, the gate pull transistor is provided using a dummy transistor or an otherwise unassigned transistor within a driver layout in the IC device.

BRIEF DESCRIPTION OF THE DRAWINGS

FIG. 14 relates to an interface circuit that includes NMOS gate-pull transistors coupled to a power rail and NMOS driver transistors in accordance with certain aspects of this disclosure.

DETAILED DESCRIPTION

Figure 1:
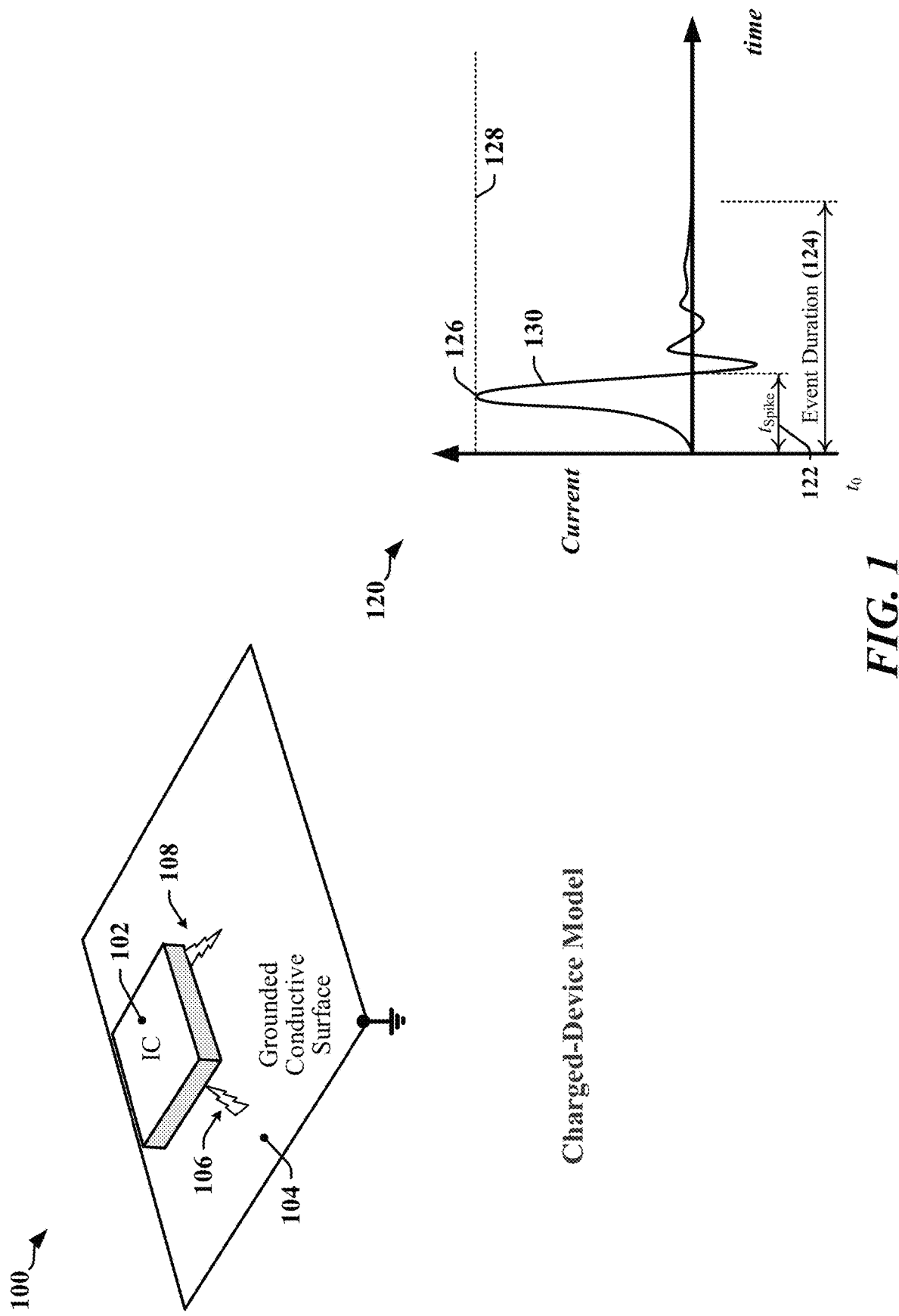
FIG. 1 illustrates an example of ESD event.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

The evolution of transistor technology has led to decreased gate oxide thickness and lower operating voltages. The reduction in gate oxide thickness reduces the maximum gate-drain, gate-source voltage that can be withstood by the device during an ESD event. Moreover, ICs typically provide multiple voltage domains for power saving purposes. For example, higher voltage domains provide power at higher voltage levels than lower voltage domains. Higher voltage domains are sometimes needed for interfacing with external devices, while the core circuits can generally operate at the lower voltage levels available in lower voltage domains. A stack of low threshold voltage transistors can be used as I/O drivers that switch within voltage ranges greater than the voltage ranges used by core circuits.

Electrostatic discharge (ESD) events can generate voltages or currents within an IC device that exceed rated operating parameters, including rated operating voltage. Rated operating voltage may lie within a nominal operating range of voltage levels defined for certain devices, circuits or input/out (I/O) pads. As used herein, an I/O pad may be defined as a structure that is part of a coupling that conducts signals between internal circuits of the core of an IC device and the external terminals, connectors or pins of a chip package that carries the IC device. In one example, I/O pads may be coupled to external terminals, connectors or pins through wires that are thermosonically bonded to the I/O pads. In another example, I/O pads may be coupled to external terminals, connectors or pins through solder balls that contact the I/O pads. Without adequate protection, circuits can be damaged near I/O pads or near other sources or entry points of the ESD events. ESD events may occur due to some combination of grounding failures, handling and accumulation of static charge at a surface or point of contact near the IC device.

Certain aspects of this disclosure are described in relation to a charged-device model (CDM) characterization of ESD events. The CDM relates to an ESD event that occurs when a chip, chip carrier or package that includes an IC device contacts a low impedance electrical path. A sudden discharge of energy can occur if the chip, chip carrier or package is carrying an accumulated electrostatic charge, causing a high-voltage pulse or spike at I/O pads of the IC device. The voltage observable at one or more I/O pads may exceed rated tolerances for transistors in the IC device and can cause breakdown or other damage to transistor gates and other features of the IC device if adequate ESD protection is not provided.

FIG. 1 illustrates an example of an ESD event 100 that may be characterized by a CDM. The ESD event 100 occurs as an IC device 102 is placed on a metal or other conductive surface 104. In some examples, this type of ESD event 100 may occur at a manufacturing or assembly facility when IC devices on chips, chip carriers or packages are accumulated, assembled or sorted before being placed and bonded or soldered to a circuit board. In some examples, this type of ESD event 100 may occur at a manufacturing facility when IC devices 102 are picked up by a robot and placed on a circuit board or in a shipment package, where the robot may serve as the conductive surface 104. As the IC device 102 is placed on the conductive surface 104, accumulated charge in the IC device 102 may be discharged to the conductive surface 104 through one or more potential gradients 106, 108. Discharge may occur before or after I/O pins or pads are directly coupled to the conductive surface 104.

The graph 120 illustrates an example of a type of ESD event 100 as characterized by a CDM. In this example, a high percentage of the electrostatic energy accumulated in the IC device 102 is discharged over a short period of time 122 in an initial pulse or spike 130. In one example, the ESD event 100 may have a duration 124 that lasts for approximately 5 nanoseconds with the initial spike 130 ending after approximately 1 nanosecond. In some instances, the discharge may result in a first peak 126 at a current level 128 of 4.7 amps or more. The current spike flowing through an I/O pad of the IC device 102 may cause a correspondent spike in voltage in the interface circuits of the IC device 102.

Current ESD protection schemes employed to protect output drivers typically include diodes connected between an interface pad and output power supply rails and may include a clamping circuit through the diode discharge path series path that can carry the ESD current and thereby prevent damage to driver devices.

Figure 2:
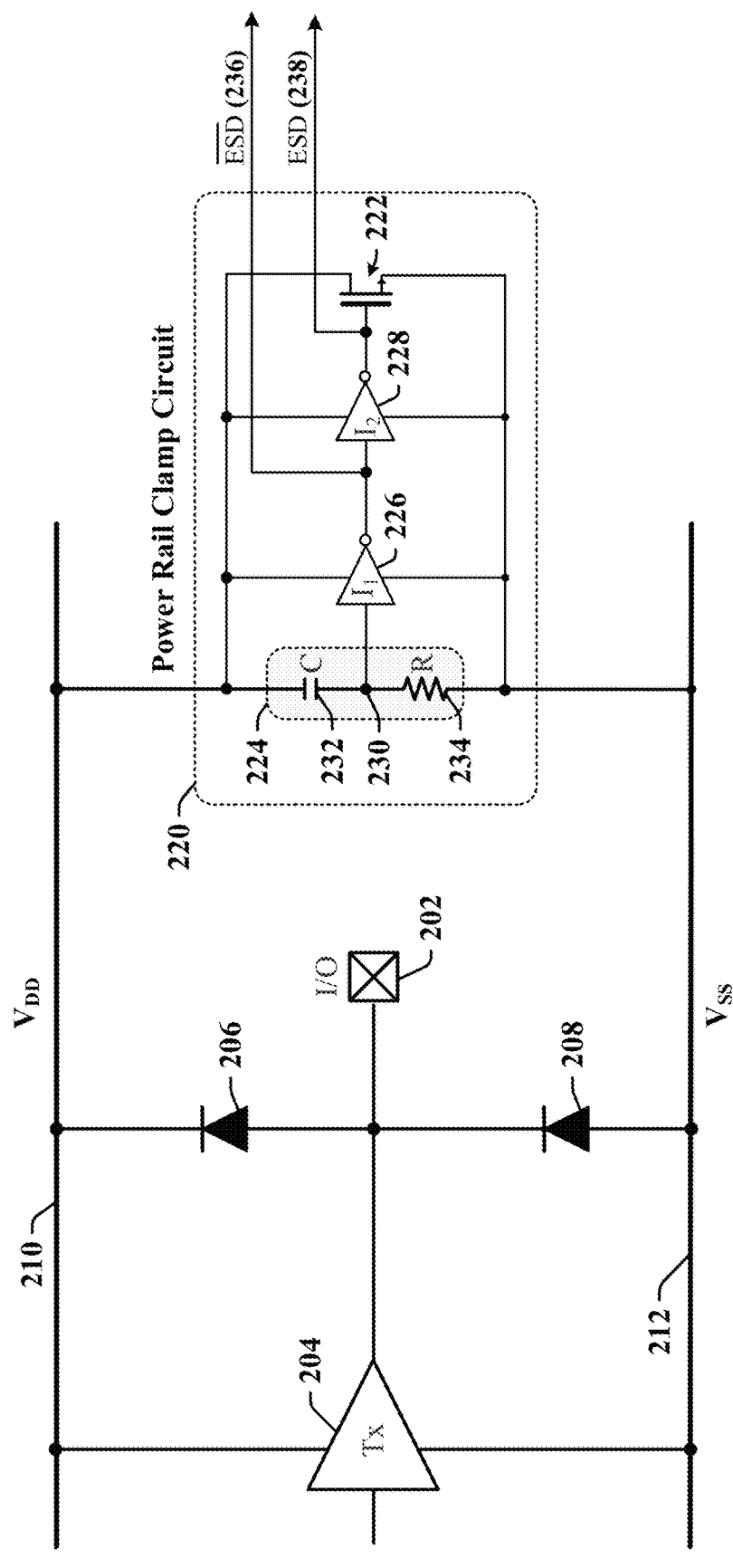
FIG. 2 illustrates a first example of an interface circuit that provides ESD protection in an IC device.

FIG. 2 illustrates a first example of an interface circuit 200 that provides ESD protection in an IC device. The interface circuit 200 includes a driver 204 that can be used to transmit signals through an I/O pad 202 of the IC device. The driver 204 may be configured to provide an output that switches between a power rail ($V_{DD}$ 210) and a ground reference ($V_{SS}$ 212). ESD protection is provided by a pair of diodes 206, 208. A first diode 206 is coupled to $V_{DD}$ 210 and to the I/O pad 202 and is reverse biased when the voltage of the I/O pad 202 remains below $V_{DD}$ 210. A second diode 208 is coupled to $V_{SS}$ 212 and to the I/O pad 202 and is reverse biased when the voltage of the I/O pad 202 remains above $V_{SS}$ 212. An ESD event may cause a current surge through the I/O pad 202 and one or more interconnects between the I/O pad 202 and the driver 204. The interconnects have a low resistance that can significantly change the voltage of the I/O pad 202 when conducting a multi-amp ESD surge current. The change in voltage may be sufficient to forward bias one of the diodes 206, 208, thereby enabling the ESD surge current to be diverted to $V_{DD}$ 210 or $V_{SS}$ 212 away from the driver 204 and other circuits of the IC device.

The diversion of the ESD surge current to $V_{DD}$ 210 or $V_{SS}$ 212 can increase the voltage difference between $V_{DD}$ 210 and $V_{SS}$ 212, which can stress or damage devices in the interface circuit 200 if left unchecked. The illustrated interface circuit 200 includes a power rail clamping circuit 220 that is coupled between $V_{DD}$ 210 and $V_{SS}$ 212. The power rail clamping circuit 220 includes an N-type metal-oxide-semiconductor (NMOS) transistor 222 that is biased by a serial RC network 224. The RC network 224 has a capacitor 232 coupled in series with a resistor 234. In the illustrated example, the serial RC network 224 is coupled between power supply $V_{DD}$ 210 and the ground reference $V_{SS}$ 212. A node 230 coupling the capacitor 232 and the resistor 234 is coupled to the gate of the transistor 222 through a buffer amplifier arrangement including first and second series-connected inverters 226, 228. The power rail clamping circuit 220 ensures a low impedance path from $V_{DD}$ 210 to $V_{SS}$ 212 when an ESD pulse applied to the I/O pad 202 causes the voltage difference between $V_{DD}$ 210 and $V_{SS}$ 212 to increase.

In one example, a rising voltage on $V_{DD}$ 210 is coupled through the capacitor 232 to the input of the first inverter 226 forcing its output to a low voltage state. In response, the output of the second inverter 228 goes high turning on the transistor 222. When the transistor 222 turns on, the ESD current can begin to flow between $V_{DD}$ 210 and $V_{SS}$ 212. Some ESD protection circuits provided in accordance with this disclosure may use the outputs of the first inverter 226 and the second inverter 228 as complimentary ESD event indicator signals 236, 238.

Figure 3:
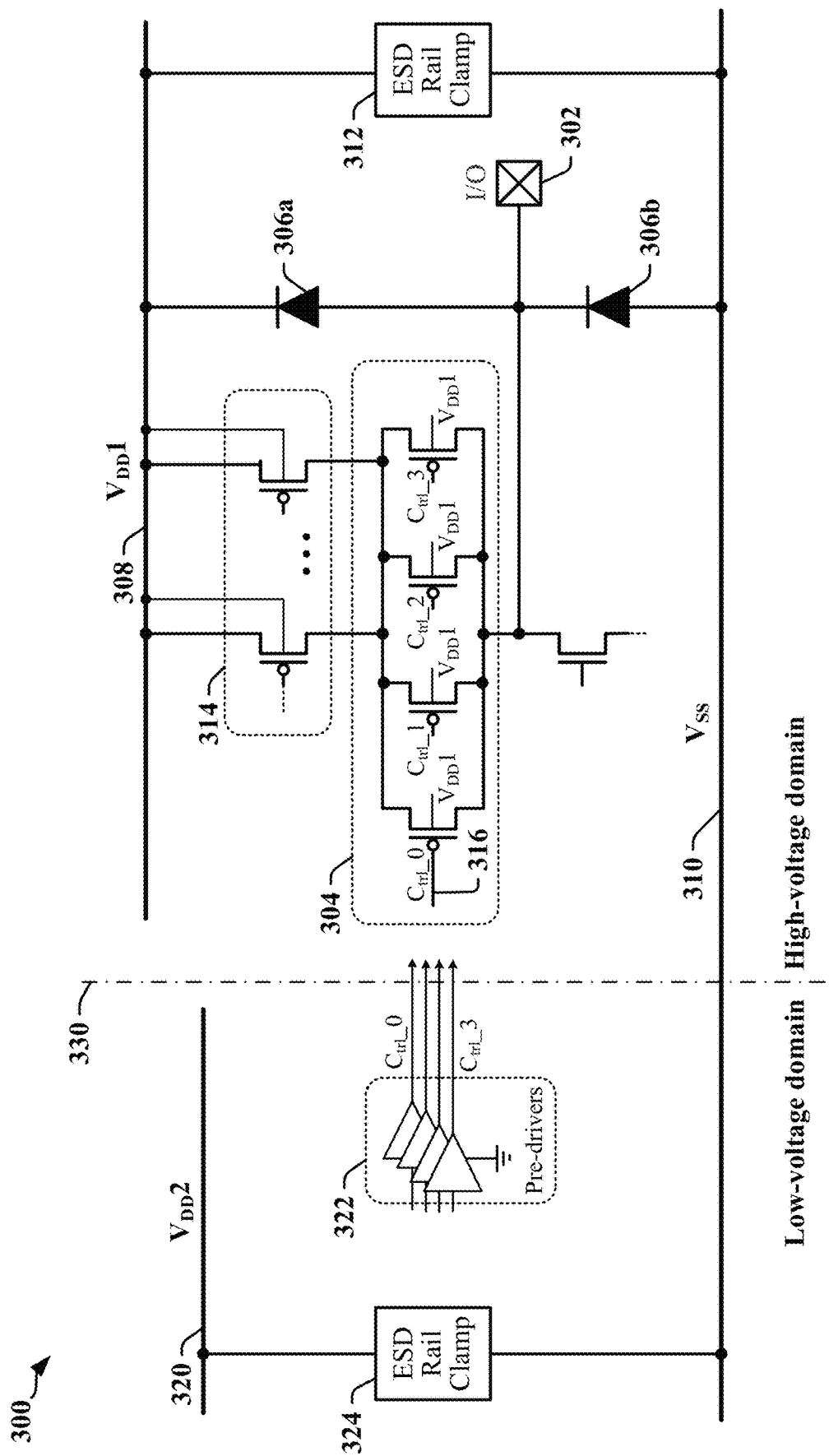
FIG. 3 illustrates a second example of an interface circuit in an IC device that includes ESD protection circuits.

FIG. 3 illustrates a second example of an interface circuit 300 in an IC device that includes ESD protection circuits. For the purposes of this description, a conceptual divide 330 is shown between a high-voltage domain and a low-voltage domain, although a clear physical separation between voltage domains may not be discernible. The high-voltage domain supplies power through the $V_{DD}1$ rail 308 at a $V_{DD}1$ voltage level and the low-voltage domain supplies power through the $V_{DD}2$ rail 320 at a $V_{DD}2$ voltage level. The interface circuit 300 includes two sets of P-type metal-oxide-semiconductor (PMOS) transistors (the PMOS driver transistors 304, 314) that are configured to drive an I/O pad 302 to $V_{DD}1$. The portion of the interface circuit 300 that pulls the I/O pad 302 to the voltage level ($V_{SS}$) of a ground reference ($V_{SS}$ rail 310) is not shown in detail. The gates of four PMOS driver transistors 304 are driven by cross domain signals ($C_{trl\_0}$-$C_{trl\_3}$) provided by low-voltage pre-driver transistors 322 operating in the low-voltage domain. The low-voltage pre-driver transistors 322 are provided to shift the signals applied to the gates 316 of PMOS driver transistors 304 from $V_{DD}2$ to $V_{DD}1$ voltage levels.

In some examples, the $V_{DD}2$ rail 320 supplies power at a lower voltage level than the $V_{DD}1$ rail 308 and low-voltage domain signals may switch between the voltage level of $V_{SS}$ and $V_{DD}2$. In these examples, $V_{DD}1$ may represent a voltage level of 3.3 volt or 1.8 volt and $V_{DD}2$ may represent a voltage level of 1.8 volt or 1.2 volt. In other examples, the core circuits can operate at the same voltage level as the interface circuits, or at a higher voltage level than the interface circuits.

A pair of diodes 306a, 306b nominally provides ESD protection for circuits coupled to the I/O pad 302, including the PMOS driver transistors 304. An increase in the voltage at the I/O pad 302 above $V_{DD}1$ can exceed the minimum forward bias voltage ($V_f$) of the diode 306a. A forward biased diode 306a can limit voltage increases at the I/O pad 302 and the rise of the voltage at the drains of the PMOS driver transistors 304 can be expected to be limited to a voltage that is not significantly greater than $V_{DD}1+V_f$. Similarly, the expected fall of voltage at the drains of the PMOS driver transistors 304 can be limited to $V_{SS}-V_f$, due to the operation of diode 306b.

In various examples, an ESD rail clamp 312 may be configured to limit variations in the voltage difference between the $V_{DD}1$ rail 308 and the ground reference voltage (i.e., $V_{DD}1-V_{SS}$). In one example, the power rail clamping circuit 220 of FIG. 2 may be configured for use as the ESD rail clamp 312. In some examples, an ESD rail clamp 324 may be configured to limit variations in the voltage difference between the $V_{DD}2$ rail 320 and the ground reference (i.e., $V_{DD}2-V_{SS}$).

Figure 4:
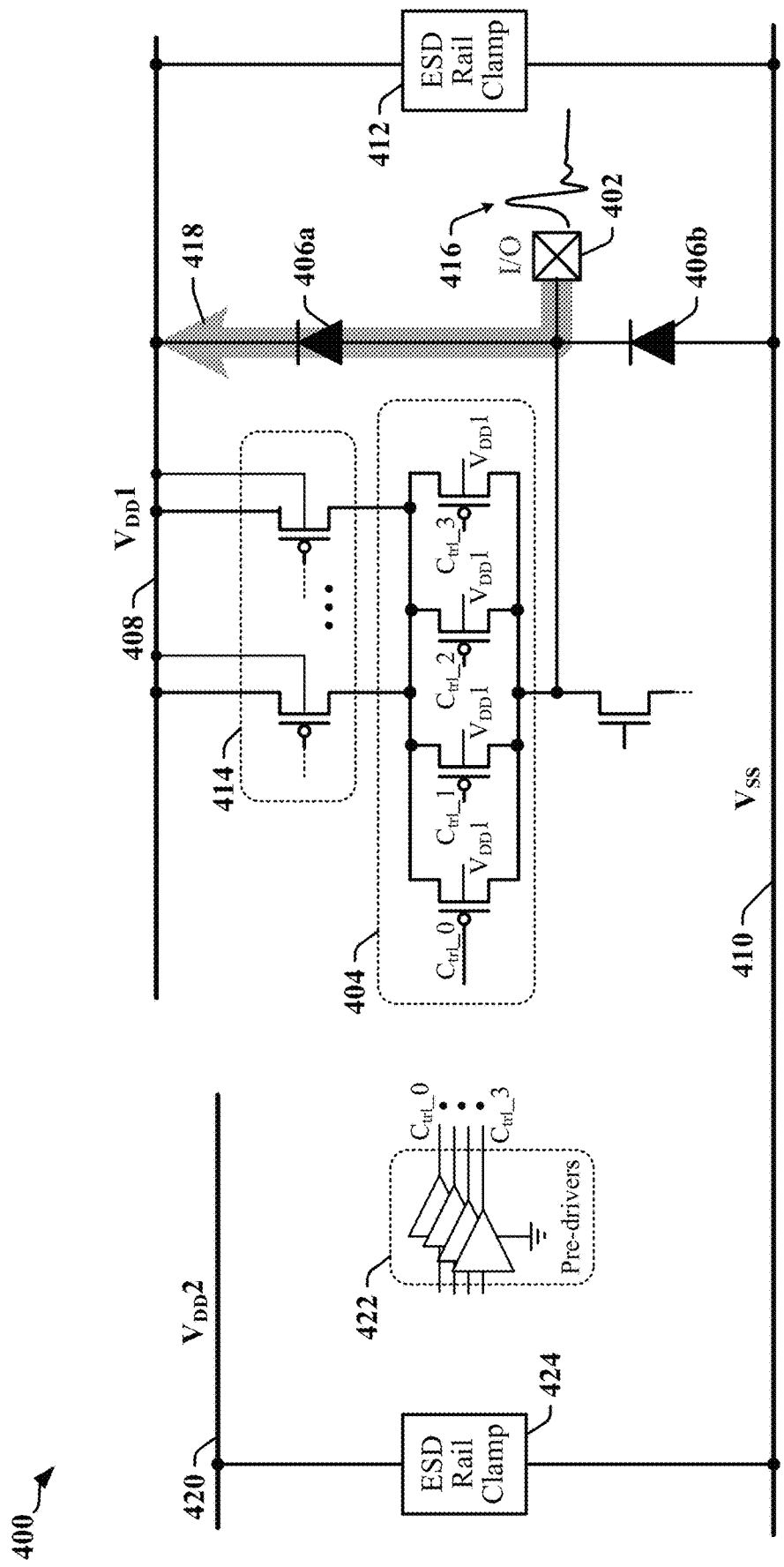
FIG. 4 illustrates the effect of an ESD event on an interface circuit in an IC device that includes ESD protection circuits.

FIG. 4 illustrates the effect of an ESD event 416 on an interface circuit 400 in an IC device that includes ESD protection circuits. ESD currents are expected to be diverted to a $V_{DD}1$ rail 408 or to a $V_{SS}$ rail 410 through one of the ESD protection diodes 406a or 406b when the ESD protection diode 406a or 406b becomes forward biased during the ESD event 416. An ESD event 416 may be simulated using a negative CDM stress test, in which an ESD current 418 enters the I/O pad 402. The ESD current 418 flowing through the I/O pad 402 may produce a voltage waveform that corresponds to that of the ESD event 100 illustrated in FIG. 1, in which the first peak 126 is positive and increases above the voltage level of the $V_{DD}1$ rail 408 of the IC device. The ESD current 418 is expected to be diverted through the ESD protection diode 406a to the $V_{DD}1$ rail 408 during negative CDM tests on the I/O pad 402.

The interface circuit 400 may be similar in certain respects to the interface circuit 300 illustrated in FIG. 3. The illustrated interface circuit 400 includes two sets of PMOS transistors 404, 414 that are configured to drive an I/O pad 402 to the voltage level ($V_{DD}1$) of the $V_{DD}1$ rail 408. The portion of the interface circuit 400 that pulls the I/O pad 402 to the voltage of a ground reference (here, the $V_{SS}$ rail 410) is not shown in detail. The gates of four PMOS driver transistors 404 are driven by cross domain signals ($C_{trl\_0}$-$C_{trl\_3}$) provided by low-voltage pre-driver transistors 422 operating at a lower, $V_{DD}2$ voltage level. The low-voltage pre-driver transistors 422 are provided to shift the signals applied to the gates of the PMOS driver transistors 404 from a low-voltage domain to a high-voltage domain. The low-voltage domain signals may switch between $V_{SS}$ and $V_{DD}2$. In some examples, $V_{DD}1$ represents a voltage level of 3.3 volt or 1.8 volt. In some examples, $V_{DD}2$ represents a voltage level of 1.8 volt or 1.2 volt.

A pair of ESD protection diodes 406a, 406b coupled between the $V_{DD}1$ rail 408 and the $V_{SS}$ rail 410 is provided for ESD protection of circuits coupled to the I/O pad 402, including the PMOS driver transistors 404. In one example, a simulation of an ESD event 416 may be configured to produce a 250 Volt peak voltage at the I/O pad 402. The ESD protection diode 406a coupled to the $V_{DD}1$ rail 408 becomes forward biased when the voltage at the I/O pad 402 exceeds $V_{DD}1+V_f$, where $V_f$ represents the forward bias voltage of the ESD protection diode 406a. The forward-biased ESD protection diode 406a diverts the ESD current 418 generated by the ESD event 416 to the $V_{DD}1$ rail 408.

Rises in voltage level of the $V_{DD}1$ rail 408 caused by shunting the ESD current to the $V_{DD}1$ rail 408 (or to the $V_{SS}$ rail 410) may be mitigated through an ESD rail clamping circuit 412. The ESD rail clamping circuit 412 is configured to limit variations in the voltage difference between the $V_{DD}1$ rail 408 and ground (i.e., $V_{DD}1-V_{SS}$). In the low-voltage domain, an ESD rail clamping circuit 424 may be configured to limit variations in the voltage difference between a $V_{DD}2$ rail 420 and ground (i.e., $V_{DD}2-V_{SS}$). In one example, the power rail clamping circuit 220 of FIG. 2 may be configured for use as the ESD rail clamping circuit 412.

Conventional ESD protection circuits may protect the I/O devices operating in higher voltage domains but can leave the interface between low voltage and high voltage domains susceptible to ESD-related damage. For example, damage may occur to the PMOS driver transistors 404, which have gates driven by cross-voltage domain signals.

Figure 5:
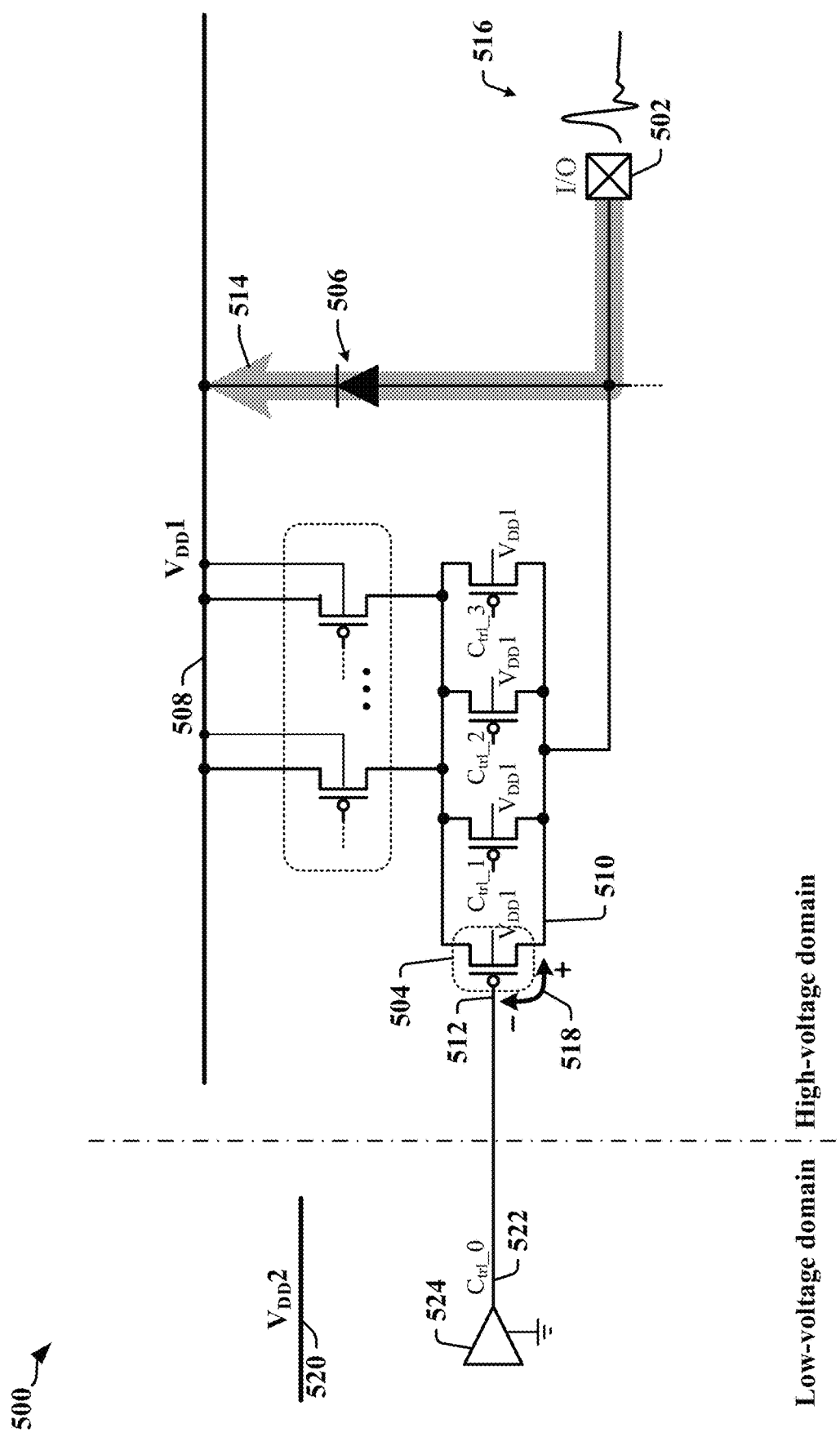
FIG. 5 provides an isolation view of P-type metal-oxide-semiconductor (PMOS) driver transistors during an ESD event that includes a current flow into the I/O pad of an IC device.

FIG. 5 provides an isolation view 500 of PMOS driver transistors 504 during an ESD event 516 resulting from a negative CDM test on the I/O pad 502 of an IC device. The ESD event 516 may relate to a negative CDM stress test, in which an ESD current 514 enters the I/O pad 502. The ESD current 514 may have a waveform that corresponds to that of the ESD event 100 illustrated in FIG. 1, in which the first peak 126 is positive and increases above the nominal $V_{DD}1$ voltage level of the $V_{DD}1$ rail 508 that supplies power in the IC device. The ESD current 514 is expected to be diverted through the ESD protection diode 506 to the $V_{DD}1$ rail 508 during negative CDM tests on the I/O pad 502 of the IC device. In some instances, overvoltage conditions occurring between the drain 510 and gate 512 of a PMOS driver transistor 504 during the ESD event 516 can damage the PMOS driver transistor 504. A sufficiently high difference voltage 518 (|Vgd|) between the drain 510 and gate 512 of the PMOS driver transistor 504 can cause physical breakdown of the transistor gate.

The difference voltage 518 that reaches a damaging overvoltage level during the ESD event 516 may be attributable to the cross-domain signal 522 that drives the gate 512 of the PMOS driver transistor 504. For example, the ESD event 516 may cause a sudden increase in voltage of the power supply rail (here, the $V_{DD}1$ rail 508) that supplies power within the voltage domain of the PMOS driver transistor 504. The increase in voltage of the $V_{DD}1$ rail 508 may not be closely tracked by changes in the $V_{DD}2$ rail 520 that supplies power within the voltage domain of a pre-driver 524. The pre-driver 524 provides a cross-domain signal 522 to the gate 512 of the PMOS driver transistor 504. A resultant increase in voltage difference between the $V_{DD}1$ rail 508 and the $V_{DD}2$ rail 520 may propagate as an increase in relative voltage between the cross-domain signal 522 and voltage at the drain 510 of the PMOS driver transistor 504. In one example, the absolute voltage of the cross-domain signal 522 may remain constant for a short period of time while the voltage at the drain 510 follows the voltage of the I/O pad 502 during the ESD event 516, thereby causing a change in the difference voltage 518 sufficient to damage the PMOS driver transistor 504. Delays in the operation of the ESD rail clamping circuits 412, 424 (see FIG. 4) may cause the change in voltage difference between the $V_{DD}1$ rail 508 and the $V_{DD}2$ rail 520.

The application of a 250 Volt ESD peak voltage to the I/O pad 502 can cause an overvoltage condition between the drain 510 and gate 512 of a PMOS driver transistor 504 regardless of the existence or magnitude of the polarity of voltage difference between the $V_{DD}1$ rail 508 and the $V_{DD}2$ rail 520. The overvoltage condition can occur whether $V_{DD}1>V_{DD}2$, $V_{DD}1<V_{DD}2$, or $V_{DD}1=V_{DD}2$. In some instances, the overvoltage condition can occur due to AC decoupling of one or more power or ground rails are AC decoupled between sections of an IC device. The ESD events 416, 516 are described in relation to an interface circuit that is constructed from double-stacked PMOS transistors, although the ESD-induced overvoltage conditions may affect interface circuit constructed from NMOS transistors, or using single, triple or more stacks of transistors.

Certain aspects of this disclosure can reduce or eliminate overvoltage conditions resulting from interactions between an ESD event and multiple voltage domains or voltage rails. In some examples, gate-pull circuits may be employed to reduce transient gate-drain voltage differences during ESD events. Gate-pull circuits may be configured to prevent overvoltage conditions that may otherwise occur between the drain 510 and gate 512 of a PMOS driver transistor 504 during the ESD event 516 described in FIG. 5. Gate-pull circuits may be employed to prevent overvoltage conditions that can affect or PMOS or NMOS driver transistors in various interface circuits. In one example, a gate-pull circuit is coupled between the gate of a driver transistor and either a voltage rail or an I/O pad. the gate-pull circuit is turned on when the voltage level of the voltage rail or I/O pad is affected by an ESD event. When turned on, the gate-pull circuit pulls the voltage level of the gate of the driver transistor toward the voltage level of the I/O pad and can thereby reduce the voltage differential between the gate and drain of the driver transistor.

Figure 6:
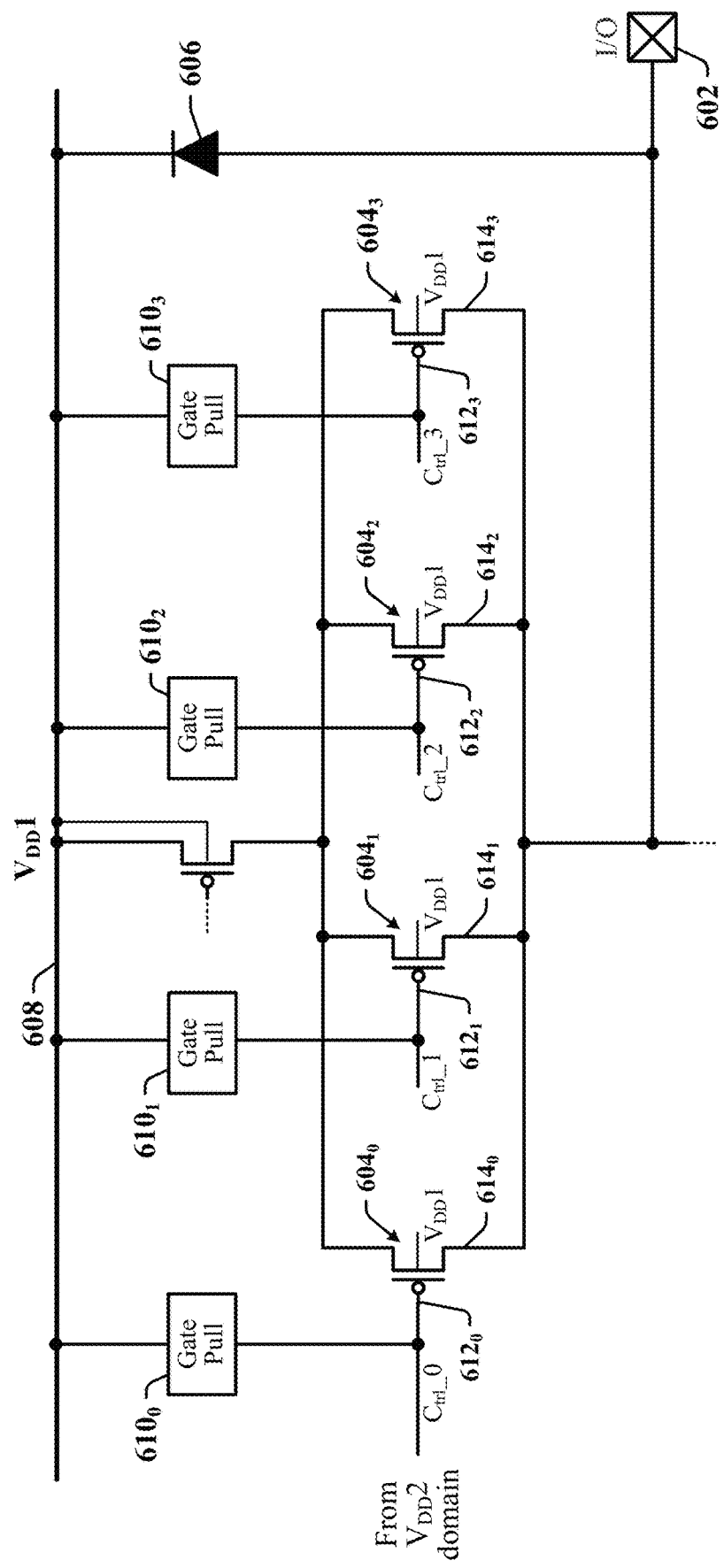
FIG. 6 illustrates a first configuration of gate-pull circuits in accordance with certain aspects of this disclosure.

FIG. 6 relates to an interface circuit 600 that illustrates a first configuration of gate-pull circuits $610_0$-$610_3$ in accordance with certain aspects of this disclosure. The gate-pull circuits $610_0$-$610_3$ are configured to pull the gates $612_0$-$612_3$ of PMOS driver transistors $604_0$-$604_3$ to the voltage level of a rail of a power supply (here, the $V_{DD}1$ rail 608) in an IC device during an ESD event. The ESD event may be modeled, characterized or initiated as a negative CDM test on an I/O pad 602 of the IC device. In one example, the ESD event corresponds to a negative CDM stress test, in which an ESD current enters the I/O pad 602 and is directed through the ESD protection diode 606 to the $V_{DD}1$ rail 608. During the ESD event, the gate-pull circuits $610_0$-$610_3$ are enabled and a high potential is applied to the gates $612_0$-$612_3$ of the PMOS driver transistors $604_0$-$604_3$.

The gate-pull circuits $610_0$-$610_3$ can reduce the voltage difference between gates $612_0$-$612_3$ and corresponding drains $614_0$-$614_3$ of the PMOS driver transistors $604_0$-$604_3$ during ESD events by providing a low impedance path between the PMOS driver transistors $604_0$-$604_3$ and the $V_{DD}1$ rail 608. In some examples, the gate-pull circuits $610_0$-$610_3$ can be configured to pull the gates $612_0$-$612_3$ of the PMOS driver transistors $604_0$-$604_3$ to the voltage level of the $V_{DD}1$ rail 608 during a negative CDM ESD test. The gate-pull circuits $610_0$-$610_3$ can maintain the gates $612_0$-$612_3$ of the PMOS driver transistors $604_0$-$604_3$ close to the voltage level of the drains $614_0$-$614_3$ of the PMOS driver transistors $604_0$-$604_3$ during ESD events. In some examples, the voltage level of the gates $612_0$-$612_3$ differs from the voltage level of the drains $614_0$-$614_3$ by approximately the forward bias voltage of the ESD protection diode 606. The gate-pull circuits $610_0$-$610_3$ are configured to remain in a high impedance state during normal circuit operating conditions.

Figure 7:
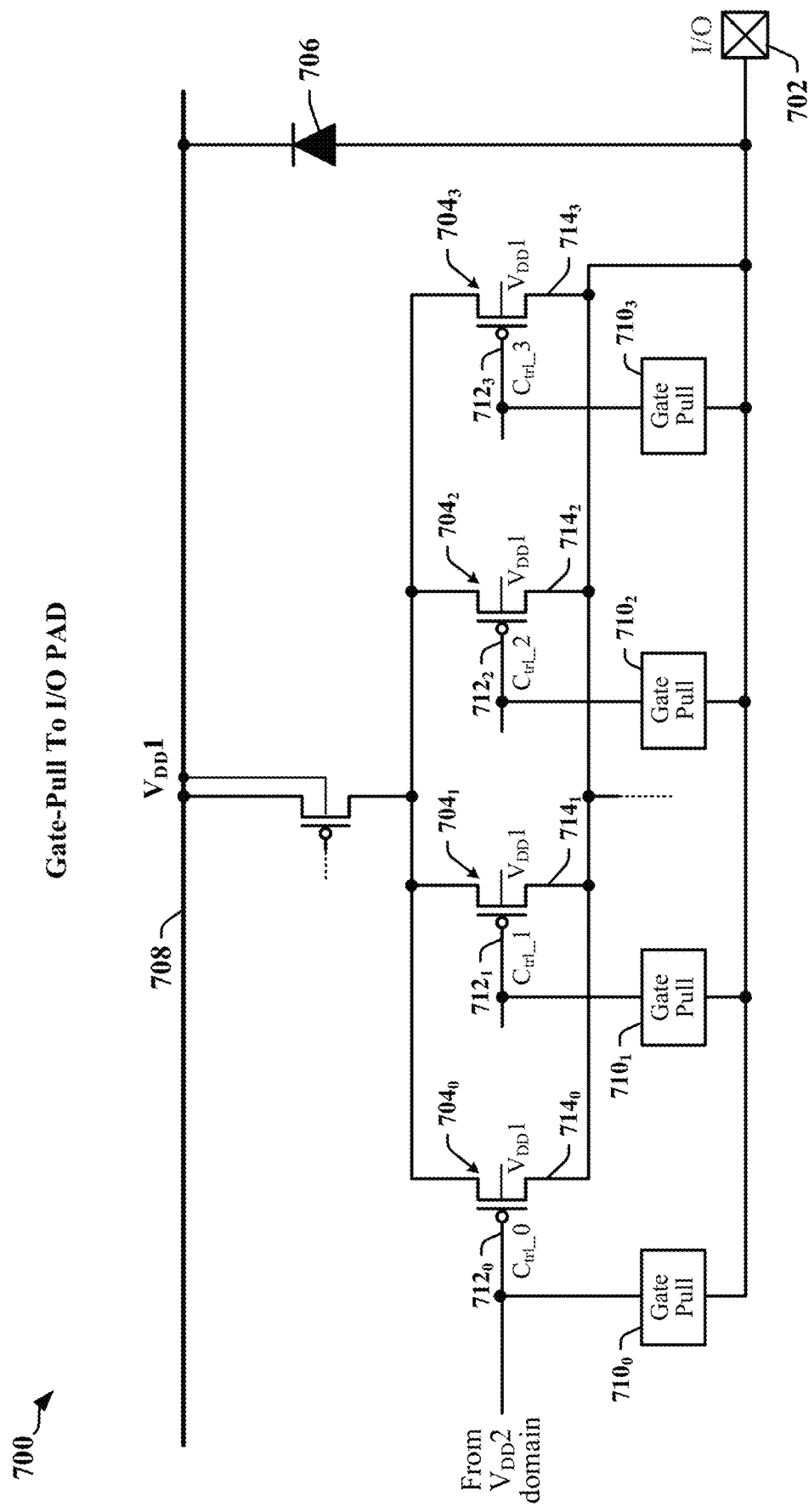
FIG. 7 illustrates a second configuration of gate-pull circuits in accordance with certain aspects of this disclosure.

FIG. 7 relates to an interface circuit 700 in an IC device that illustrates a second configuration of gate-pull circuits $710_0$-$710_3$ in accordance with certain aspects of this disclosure. The gate-pull circuits $710_0$-$710_3$ are configured to pull the gates $712_0$-$712_3$ of the PMOS driver transistors $704_0$-$704_3$ to the voltage level of an I/O pad 702 during an ESD event. The ESD event may be modeled, characterized or initiated as a negative CDM test on the I/O pad 702 of an IC device. In one example, the ESD event corresponds to a negative CDM stress test, in which an ESD current enters the I/O pad 702 and is directed through the ESD protection diode 706 to a voltage rail (here, the $V_{DD}1$ rail 708). During the ESD event, the gate-pull circuits $710_0$-$710_3$ are enabled and a high potential is applied to the gates $712_0$-$712_3$ of the PMOS driver transistors $704_0$-$704_3$.

The gate-pull circuits $710_0$-$710_3$ can reduce the voltage difference between gates $712_0$-$712_3$ and corresponding drains $714_0$-$714_3$ of the PMOS driver transistors $704_0$-$704_3$ during ESD events by providing a low impedance path between the PMOS driver transistors $704_0$-$704_3$ and the I/O pad 702. In this example, the gate-pull circuits $710_0$-$710_3$ are configured to pull the gates $712_0$-$712_3$ of the PMOS driver transistors $704_0$-$704_3$ to the voltage level of the I/O pad 702 during negative CDM ESD test. The drains $714_0$-$714_3$ of the PMOS driver transistors $704_0$-$704_3$ are also coupled to the I/O pad 702 and the gate-pull circuits $710_0$-$710_3$ can maintain the gates $712_0$-$712_3$ of the PMOS driver transistors $704_0$-$704_3$ close to the voltage level of the drains $714_0$-$714_3$ of the PMOS driver transistors $704_0$-$704_3$ during ESD events. The gate-pull circuits $710_0$-$710_3$ may be configured to remain in a high impedance state during normal circuit operating conditions.

Figure 8:
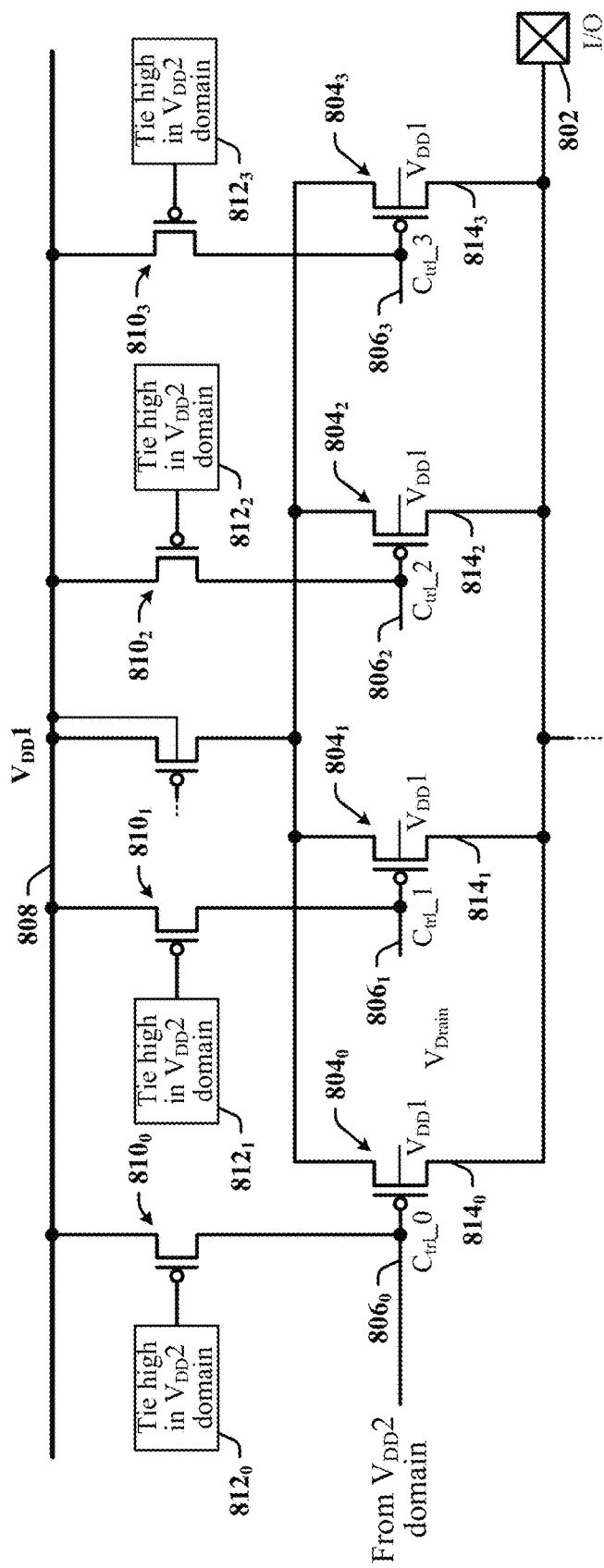
FIG. 8 relates to an interface circuit that includes PMOS gate-pull transistors coupled to a power rail and PMOS driver transistors in accordance with certain aspects of this disclosure.

FIG. 8 relates to an interface circuit 800 in an IC device that includes PMOS driver transistors $804_0$-$804_3$ and PMOS gate-pull transistors $810_0$-$810_3$ configured in accordance with certain aspects of this disclosure. The PMOS gate-pull transistors $810_0$-$810_3$ are configured to pull the gates $806_0$-$806_3$ of the PMOS driver transistors $804_0$-$804_3$ to the voltage level of a rail of a power supply (here, the $V_{DD}1$ rail 808) during an ESD event. In one example, the gates of the PMOS gate-pull transistors $810_0$-$810_3$ may be tied to a $V_{DD}2$ rail in a different, low-voltage domain through a tie-high circuit $812_0$-$812_3$. The tie-high circuit $812_0$-$812_3$ is implemented using a direct coupling to the $V_{DD}2$ rail. In another example, the tie-high circuit $812_0$-$812_3$ is implemented using passive components such as resistors to couple the gates of the PMOS gate-pull transistors $810_0$-$810_3$ to the $V_{DD}2$ rail.

During normal operation, the PMOS gate-pull transistors $810_0$-$810_3$ are turned off and maintained in an off state. A negative CDM-type ESD event causes the potential of the I/O pad 802 to be raised to a higher voltage level than the voltage level of the $V_{DD}1$ rail 808 and the $V_{DD}2$ rail. The PMOS gate-pull transistors $810_0$-$810_3$ are turned on and reduce the voltage difference (|Vgd|) between the gates $806_0$-$806_3$ and the drains $814_0$-$814_3$.

Each of the PMOS gate-pull transistors $810_0$-$810_3$ in the interface circuit 800 is typically not matched with any other transistor in the interface circuit 800 or elsewhere and can be implemented using matched or unmatched gates that are initially designated as spare or otherwise unused gates within the portion of an IC layout that includes the interface circuit 800. In one example, certain technologies or designs provide unused transistors for balancing purposes on two edges of a driver layout group. In other examples, unused transistors may be present at or near the center of a driver layout group. A driver layout group may define the physical location within the IC of a group of gates used to implement the interface circuit 800. In some instances, unused transistors may have an elongated physical shape and may be referred to as "dummy fingers" or "dummy transistors." In some examples, unused transistors, which may also be referred to as unassigned transistors, may be provided in certain areas of the IC device to assist in preventing transistor performance mismatch due to layout dependent effects. The unused transistors may have the structure of a used transistor without having connections to another transistor, device or circuit. The PMOS gate-pull transistors $810_0$-$810_3$ remain at high-impedance during normal operations and do not affect the operation of other IC circuits. Accordingly, it is possible to use one or more of these dummy transistors or unassigned transistors to implement PMOS gate-pull transistors $810_0$-$810_3$ for ESD protection purposes. It will be appreciated that a transistor selected during design layout for use as a PMOS gate-pull transistor $810_0$-$810_3$ from a group or block of transistors designated as unassigned transistors may be physically adjacent to one or more unused and unassigned transistors in the final IC layout.

Figure 9:
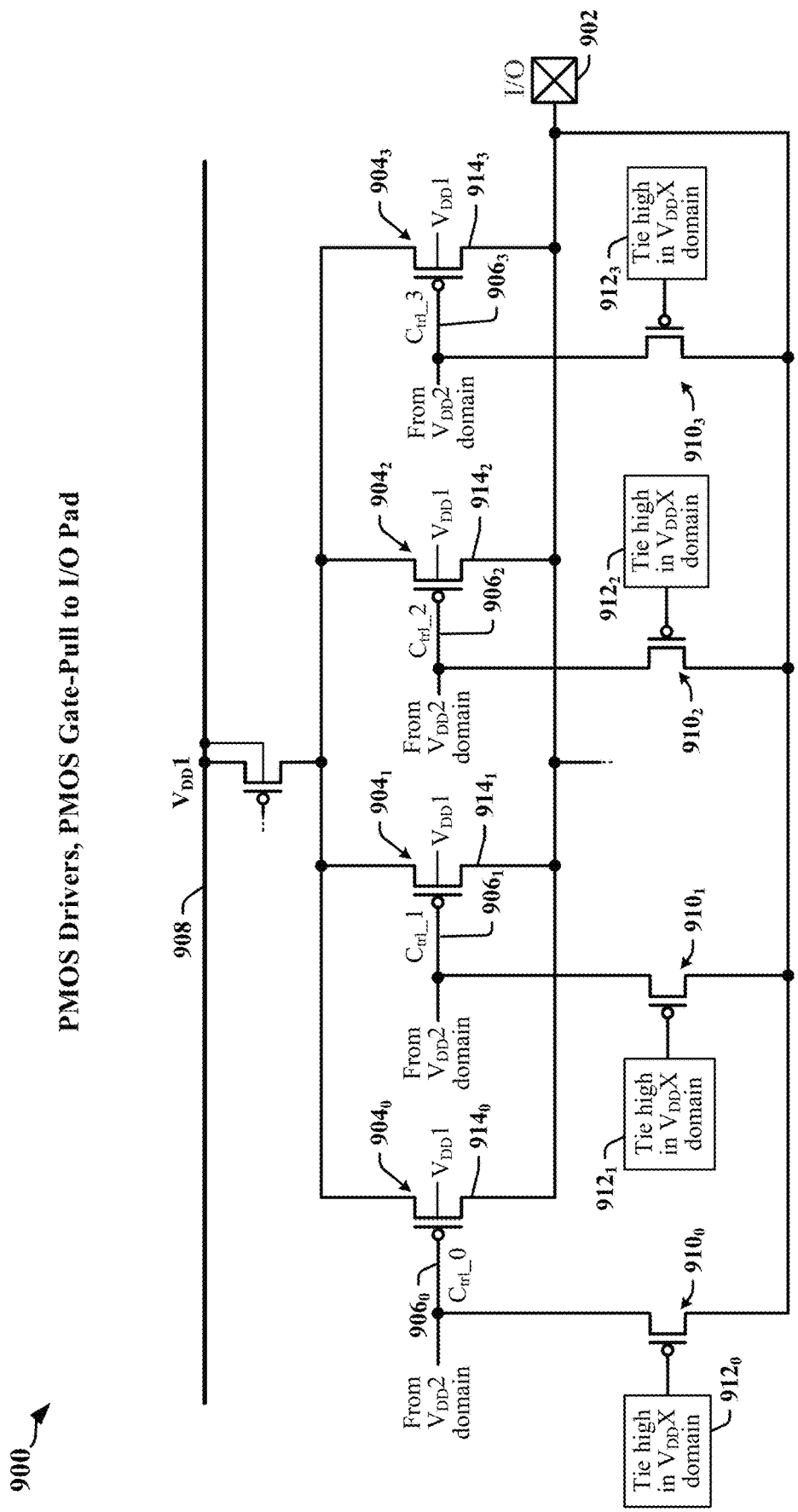
FIG. 9 relates to an interface circuit that includes PMOS gate-pull transistors coupled to an I/O pad and PMOS driver transistors in accordance with certain aspects of this disclosure.

FIG. 9 relates to an interface circuit 900 in an IC device that includes PMOS driver transistors $904_0$-$904_3$ and PMOS gate-pull transistors $910_0$-$910_3$ configured in accordance with certain aspects of this disclosure. The PMOS gate-pull transistors $910_0$-$910_3$ may be coupled between the gates $906_0$-$906_3$ of the PMOS driver transistors $904_0$-$904_3$ and an I/O pad 902. The PMOS gate-pull transistors $910_0$-$910_3$ may be configured to pull the gates $906_0$-$906_3$ of the PMOS driver transistors $904_0$-$904_3$ to the voltage level of the I/O pad 902 during an ESD event. The gates of the PMOS gate-pull transistors $910_0$-$910_3$ may be tied to a rail of a power supply (the $V_{DD}1$ rail 908 or to a $V_{DD}2$ rail in a different voltage domain) through a tie-high circuit $912_0$-$912_3$. In one example, the tie-high circuit $912_0$-$912_3$ is implemented using a direct coupling to the $V_{DD}1$ rail 908. In another example, the tie-high circuit $912_0$-$912_3$ is implemented using a direct coupling to the $V_{DD}2$ rail. In some instances, the tie-high circuit $912_0$-$912_3$ is implemented using passive components such as resistors to couple the gates of the PMOS gate-pull transistors $910_0$-$910_3$ to the $V_{DD}1$ rail 908 or to the $V_{DD}2$ rail.

During normal operation, the PMOS gate-pull transistors $910_0$-$910_3$ are turned off and maintained in an off state. A negative CDM-type ESD event causes the potential of the I/O pad 902 to be raised to a higher voltage level than the $V_{DD}1$ rail 908 and the $V_{DD}2$ rail. The PMOS gate-pull transistors $910_0$-$910_3$ are turned on and can reduce the voltage difference (|Vgd|) between the gates $906_0$-$906_3$ and the drains $914_0$-$914_3$.

Each of the PMOS gate-pull transistors $910_0$-$910_3$ in the interface circuit 900 is typically not matched with any other transistor in the interface circuit 900 or elsewhere and can be implemented using spare or otherwise unused gates near the interface circuit 900 within an IC. In one example, certain technologies or designs have unused transistors on two edges of a driver layout group for balancing purposes. In other examples, unused transistors may be present at or near the center of a driver layout group. The unused transistors may have an elongated physical shape and may be referred to as "dummy fingers" or "dummy transistors." In some examples, unused transistors, which may also be referred to as unassigned transistors, may be provided in an area of the IC device to assist in preventing transistor performance mismatch due to layout dependent effects. The PMOS gate-pull transistors $910_0$-$910_3$ remain at high-impedance during normal operations and do not affect the operation of other IC circuits. Accordingly, it is possible to use one or more of these dummy transistors or unassigned transistors to implement PMOS gate-pull transistors $910_0$-$910_3$ for ESD protection purposes.

Figure 10:
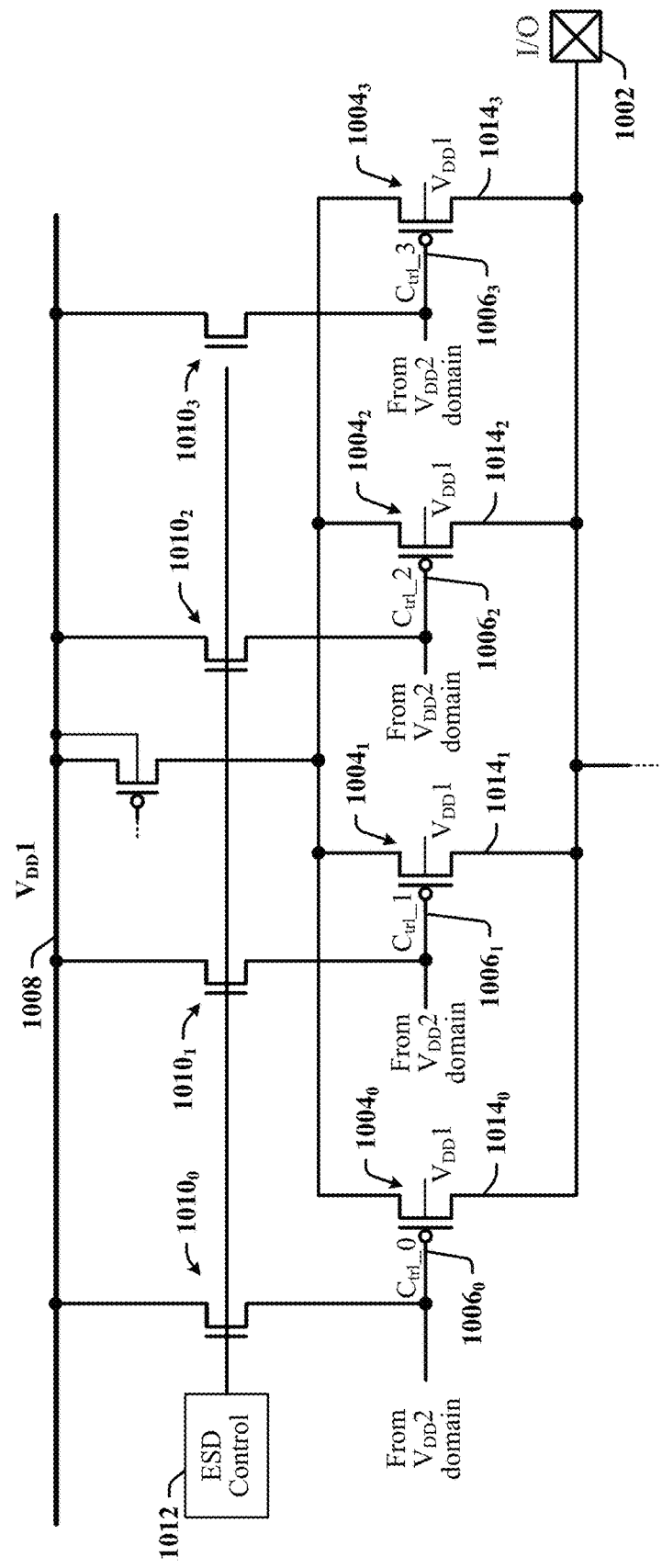
FIG. 10 relates to an interface circuit that includes N-type metal-oxide-semiconductor (NMOS) gate-pull transistors coupled to a power rail and PMOS driver transistors in accordance with certain aspects of this disclosure.

FIG. 10 relates to an interface circuit 1000 in an IC device that includes PMOS driver transistors $1004_0$-$1004_3$ and NMOS gate-pull transistors $1010_0$-$1010_3$ configured in accordance with certain aspects of this disclosure. The NMOS gate-pull transistors $1010_0$-$1010_3$ are configured to pull the gates $1006_0$-$1006_3$ of the PMOS driver transistors $1004_0$-$1004_3$ to the voltage level of a rail of a power supply (here, the $V_{DD}1$ rail 1008) during an ESD event. Each of the gates of the NMOS gate-pull transistors $1010_0$-$1010_3$ may be tied to an ESD control input 1012. The ESD control inputs 1012 may be provided to indicate ESD events and to trigger or enable one or more types of ESD protection circuits. Each of the ESD control inputs 1012 may be provided by the same ESD controller. In some examples, an ESD controller may be implemented in an ESD detection circuit used in ESD rail clamps, which are commonly found in ESD protection designs. In one example, the ESD control inputs 1012 can be derived from one or more of the ESD event indicator signals 236, 238 generated by the power rail clamping circuit 220 illustrated in FIG. 2.

During normal operation, the NMOS gate-pull transistors $1010_0$-$1010_3$ are turned off and maintained in an off state. A negative CDM-type ESD event causes the potential of the I/O pad 1002 to be raised to a higher voltage level than the $V_{DD}1$ rail 1008 and a $V_{DD}2$ rail that powers pre-drivers that drive the gates $1006_0$-$1006_3$ of the PMOS driver transistors $1004_0$-$1004_3$. The NMOS gate-pull transistors $1010_0$-$1010_3$ are turned on in response to the ESD event and may reduce the voltage difference (|Vgd|) between the gates $1006_0$-$1006_3$ and the drains $1014_0$-$1014_3$.

Figure 11:
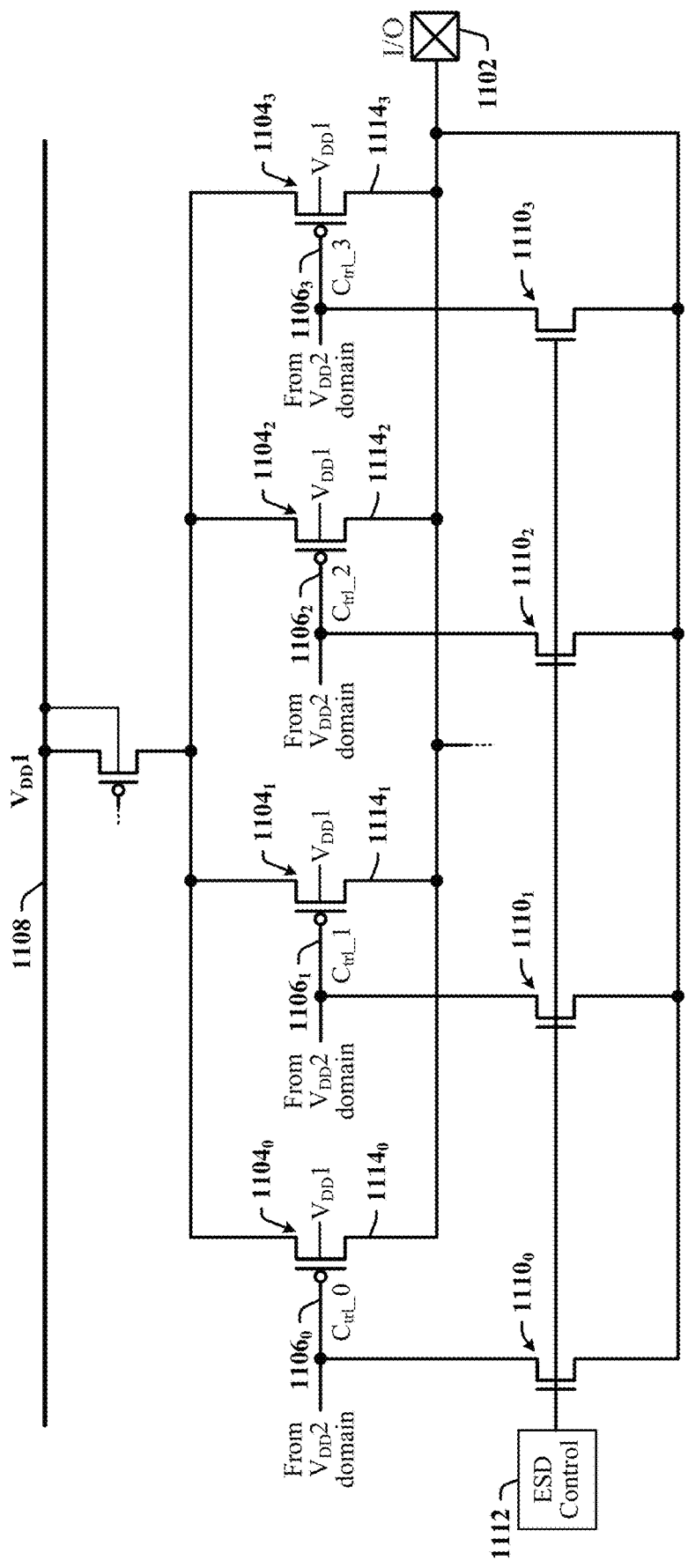
FIG. 11 relates to an interface circuit that includes NMOS gate-pull transistors coupled to an I/O pad and PMOS driver transistors in accordance with certain aspects of this disclosure.

FIG. 11 relates to an interface circuit 1100 in an IC device that includes PMOS driver transistors $1104_0$-$1104_3$ and NMOS gate-pull transistors $1110_0$-$1110_3$ configured in accordance with certain aspects of this disclosure. The NMOS gate-pull transistors $1110_0$-$1110_3$ may be coupled between the gates $1106_0$-$1106_3$ of the PMOS driver transistors $1104_0$-$1104_3$ and an I/O pad 1102. Each of the gates of the NMOS gate-pull transistors $1110_0$-$1110_3$ may be tied to an ESD control input 1112. The ESD control inputs 1112 may be provided to indicate ESD events and to trigger or enable one or more types of ESD protection circuits. The ESD control inputs 1112 may be provided by the same ESD controller. In one example, an ESD controller may be implemented in an ESD detection circuit used in ESD rail clamps, which are commonly found in ESD protection designs. The ESD control inputs 1112 can be derived from the same signal output by an ESD rail clamp.

During normal operation, the NMOS gate-pull transistors $1110_0$-$1110_3$ are turned off and maintained in an off state. A negative CDM-type ESD event causes the potential of the I/O pad 1102 to be raised to a higher voltage level than the $V_{DD}1$ rail 1108 and a $V_{DD}2$ rail (that powers pre-drivers), and the NMOS gate-pull transistors $1110_0$-$1110_3$ are turned on reducing the voltage difference (|Vgd|) between the gates $1106_0$-$1106_3$ and the drains $1114_0$-$1114_3$.

Each of the NMOS gate-pull transistors $1010_0$-$1010_3$ and $1110_0$-$1110_3$ in the interface circuits 1000, 1100 is typically not matched with any other transistor in the interface circuit 1000, 1100 or elsewhere and can be implemented using spare or otherwise unused gates near the interface circuit 1000, 1100 within an IC. In one example, certain technologies or designs provide unused transistors on two edges of a driver layout group for balancing purposes. In other examples, unused transistors may be present at or near the center of a driver layout group. The unused transistors may have an elongated physical shape and may be referred to as dummy fingers. In some examples, unused transistors, which may also be referred to as unassigned transistors, may be provided in an area of the IC device to assist in preventing transistor performance mismatch due to layout dependent effects. The NMOS gate-pull transistors $1010_0$-$1010_3$ and $1110_0$-$1110_3$ remain at high-impedance during normal operations and do not affect the operation of other IC circuits. Accordingly, it is possible to use one or more of these dummy transistors or unassigned transistors to implement NMOS gate-pull transistors $1010_0$-$1010_3$ and $1110_0$-$1110_3$ for ESD protection purposes.

The use of gate-pull transistors $810_0$-$810_3$, $910_0$-$910_3$, $1010_0$-$1010_3$, $1110_0$-$1110_3$ can enable PMOS driver transistors $804_0$-$804_3$, $904_0$-$904_3$, $1004_0$-$1004_3$, $1104_0$-$1104_3$ to more reliably withstand ESD events. Gate-pull transistors gate-pull transistors $810_0$-$810_3$, $910_0$-$910_3$, $1010_0$-$1010_3$, $1110_0$-$1110_3$ can be formed as thin gate oxide transistors or thick gate oxide transistors.

In a first example, an improvement in |Vgd| of approximately 27.18% may be expected when gate-pull transistors $810_0$-$810_3$, $1010_0$-$1010_3$ are used to pull the gates $806_0$-$806_3$, $1006_0$-$1006_3$ of PMOS driver transistors $804_0$-$804_3$, $1004_0$-$1004_3$ to $V_{DD}1$ 808, 1008. In a second example, an improvement in |Vgd| of approximately 29.73% may be expected when gate-pull transistors $910_0$-$910_3$, $1110_0$-$1110_3$ are used to pull the gates $906_0$-$906_3$, $1106_0$-$1106_3$ of PMOS driver transistors $904_0$-$904_3$, $1104_0$-$1104_3$ to the voltage level of the I/O pad 902, 1102.

Other factors may be considered when selecting between gate-pull to the $V_{DD}1$ rail 808, 1008 and gate-pull to the I/O pad 902, 1102. In one example, the coupling of gate-pull transistors $910_0$-$910_3$, $1110_0$-$1110_3$ to the I/O pad 902, 1102 can cause extra capacitive loading with respect to gate-pull to the $V_{DD}1$ rail 808, 1008. In another example, the use of gate-pull transistors $810_0$-$810_3$, $1010_0$-$1010_3$ tied to the $V_{DD}1$ rail 808, 1008 may be restricted to circuits that involve two or more voltage domains, whereas gate-pull to the voltage level of the I/O pad 802, 1002 can be used within a single voltage domain.

Figure 12:
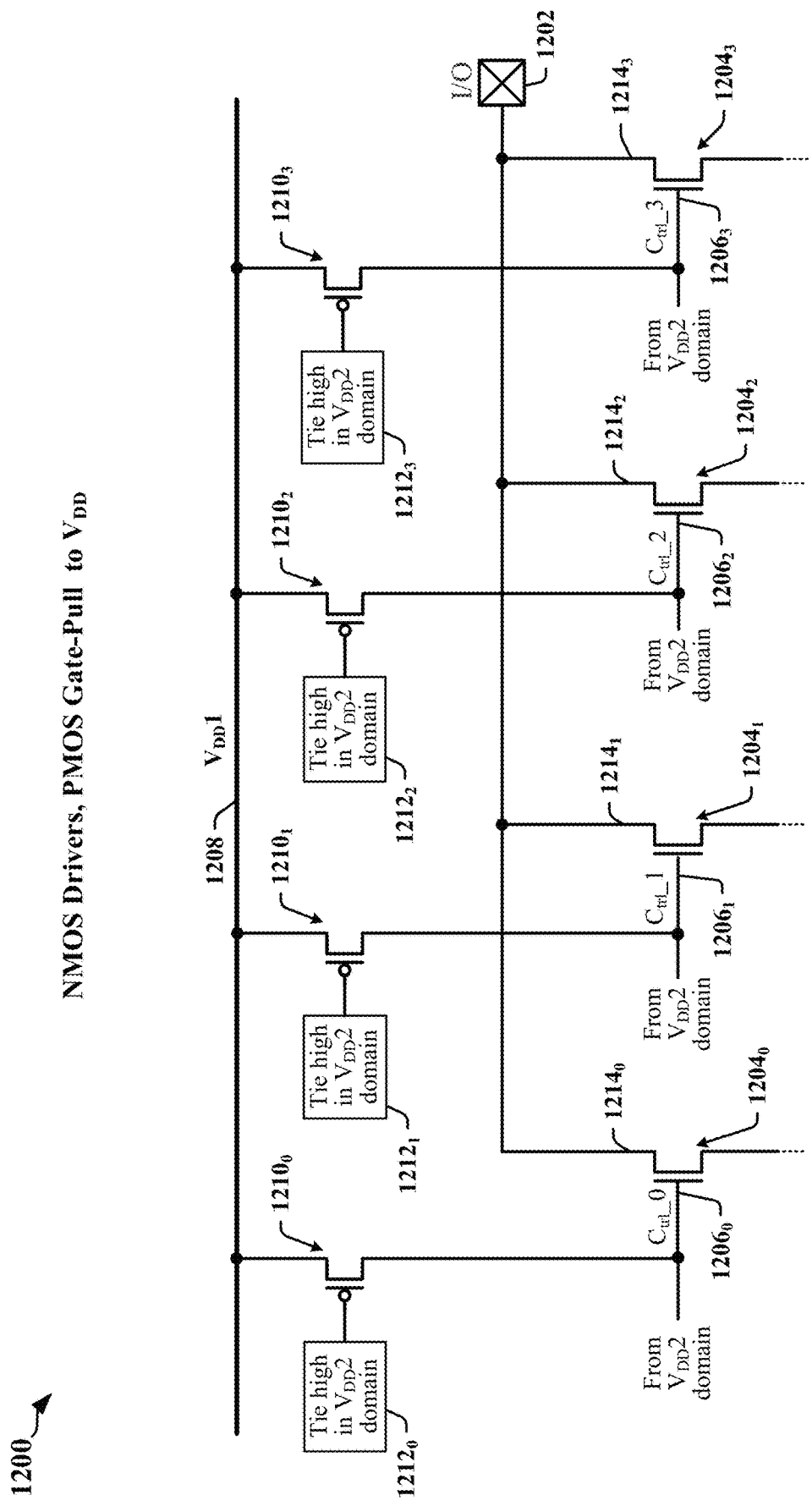
FIG. 12 relates to an interface circuit that includes PMOS gate-pull transistors coupled to a power rail and NMOS driver transistors in accordance with certain aspects of this disclosure.

In some aspects of this disclosure, gate-pull circuits may be used when NMOS transistors are used as driver transistors in an interface circuit of an IC device. FIG. 12 relates to an interface circuit 1200 in an IC device that includes NMOS driver transistors $1204_0$-$1204_3$ and PMOS gate-pull transistors $1210_0$-$1210_3$ configured in accordance with certain aspects of this disclosure. The PMOS gate-pull transistors $1210_0$-$1210_3$ are configured to pull the gates $1206_0$-$1206_3$ of the NMOS driver transistors $1204_0$-$1204_3$ to the voltage level of a rail of a power supply (here, the $V_{DD}1$ rail 1208) during an ESD event. The gates of the PMOS gate-pull transistors $1210_0$-$1210_3$ may be tied to the $V_{DD}2$ rail in a second voltage domain through a tie-high circuit $1212_0$-$1212_3$. In one example, the tie-high circuit $1212_0$-$1212_3$ is implemented using a direct coupling to the $V_{DD}2$ rail. In another example, the tie-high circuit $1212_0$-$1212_3$ is implemented using passive components such as resistors to couple the gates of the PMOS gate-pull transistors $1210_0$-$1210_3$ to the $V_{DD}2$ rail.

During normal operation, the PMOS gate-pull transistors $1210_0$-$1210_3$ are turned off and maintained in an off state. A negative CDM-type ESD event causes the potential of the I/O pad 1202 to be raised to a higher voltage level than the $V_{DD}1$ rail 1208 and the $V_{DD}2$ rail and the PMOS gate-pull transistors $1210_0$-$1210_3$ are turned on reducing the voltage difference (|Vgd|) between the gates $1206_0$-$1206_3$ and the drains $1214_0$-$1214_3$.

Figure 13:
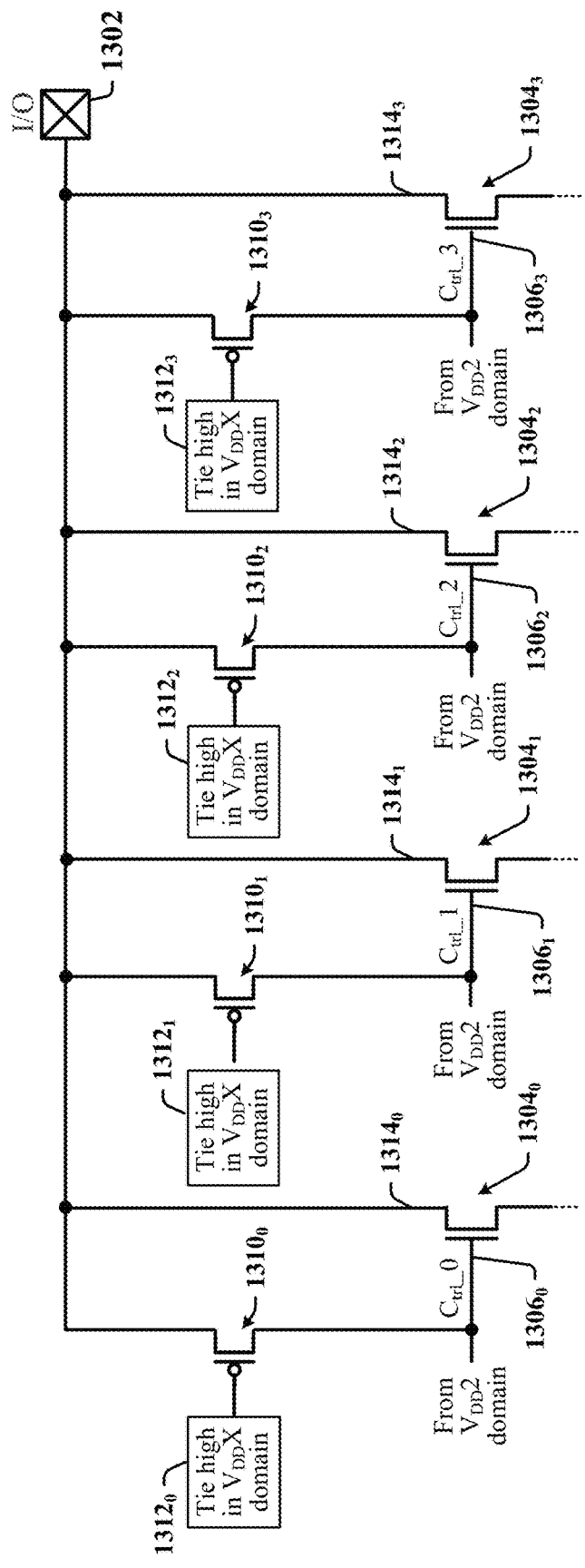
FIG. 13 relates to an interface circuit that includes PMOS gate-pull transistors coupled to an I/O pad and NMOS driver transistors in accordance with certain aspects of this disclosure.

FIG. 13 relates to an interface circuit 1300 in an IC device that includes NMOS driver transistors $1304_0$-$1304_3$ and PMOS gate-pull transistors $1310_0$-$1310_3$ configured in accordance with certain aspects of this disclosure. The PMOS gate-pull transistors $1310_0$-$1310_3$ may be coupled between the gates $1306_0$-$1306_3$ of the NMOS driver transistors $1304_0$-$1304_3$ and an I/O pad 1302. The PMOS gate-pull transistors $1310_0$-$1310_3$ may be configured to pull the gates $1306_0$-$1306_3$ of the NMOS driver transistors $1304_0$-$1304_3$ to the voltage level of the I/O pad 1302 during an ESD event. The gates of the PMOS gate-pull transistors $1310_0$-$1310_3$ may be tied to a rail of a power supply through a tie-high circuit $1312_0$-$1312_3$. In one example, the tie-high circuit $1312_0$-$1312_3$ is implemented using a direct coupling to a $V_{DD}1$ rail associated with the interface circuit. In another example, the tie-high circuit $1312_0$-$1312_3$ is implemented using a direct coupling to a $V_{DD}2$ rail associated with a core circuit. In some instances, the tie-high circuit $1312_0$-$1312_3$ is implemented using passive components such as resistors to couple the gates of the PMOS gate-pull transistors $1310_0$-$1310_3$ to the $V_{DD}1$ rail or to the $V_{DD}2$ rail.

During normal operation, the PMOS gate-pull transistors $1310_0$-$1310_3$ are turned off and maintained in an off state. A negative CDM-type ESD event causes the potential of the I/O pad 1302 to be raised to a higher voltage level than the $V_{DD}1$ rail and the $V_{DD}2$ rail, and the PMOS gate-pull transistors $1310_0$-$1310_3$ are turned on reducing the voltage difference (|Vgd|) between the gates $1306_0$-$1306_3$ and the drains $1314_0$-$1314_3$.

Each of the PMOS gate-pull transistors $1210_0$-$1210_3$, $1310_0$-$1310_3$ in the interface circuits 1200, 1300 is typically not matched with any other transistor in the interface circuit 1200, 1300 or elsewhere and can be implemented using spare or otherwise unused gates near the interface circuit 1200, 1300 within an IC. In one example, certain technologies or designs have unused transistors on two edges of a driver layout group for balancing purposes. In other examples, unused transistors may be present at or near the center of a driver layout group. The unused transistors may have an elongated physical shape and may be referred to as dummy fingers or dummy transistors. In some examples, unused transistors, which may also be referred to as unassigned transistors, may be provided in an area of the IC device to assist in preventing transistor performance mismatch due to layout dependent effects. The PMOS gate-pull transistors $1210_0$-$1210_3$, $1310_0$-$1310_3$ remain at high-impedance during normal operations and do not affect the operation of other IC circuits. Accordingly, it is possible to use one or more of these edge dummy fingers or dummy transistors and to implement PMOS gate-pull transistors $1210_0$-$1210_3$, $1310_0$-$1310_3$ for ESD protection purposes. The PMOS gate-pull transistors $1210_0$-$1210_3$, $1310_0$-$1310_3$ can be formed as thin gate oxide transistors or thick gate oxide transistors.

Figure 14:
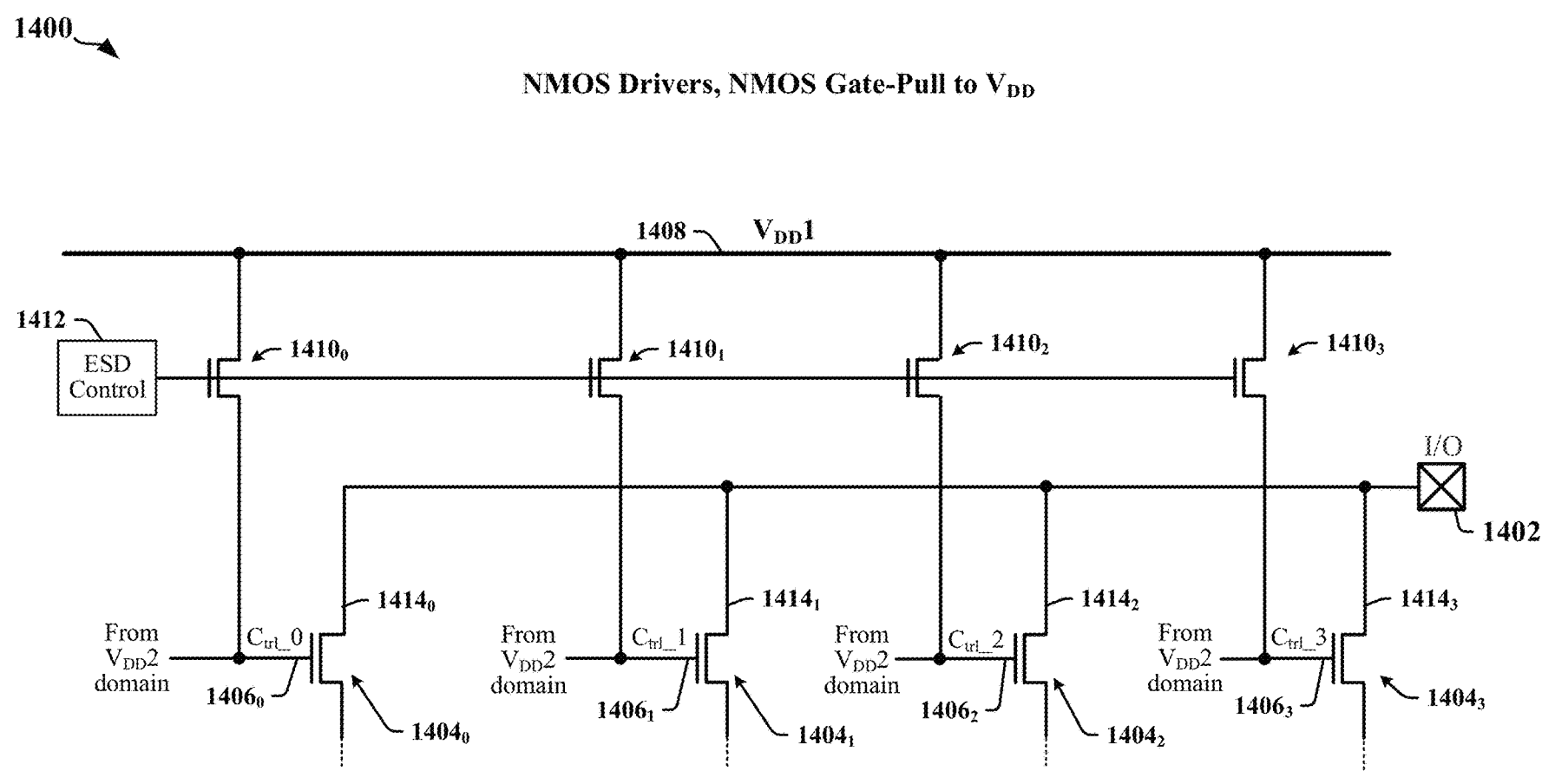

FIG. 14 relates to an interface circuit 1400 in an IC device that includes NMOS driver transistors $1404_0$-$1404_3$ and NMOS gate-pull transistors $1410_0$-$1410_3$ configured in accordance with certain aspects of this disclosure. The NMOS gate-pull transistors $1410_0$-$1410_3$ are configured to pull the gates $1406_0$-$1406_3$ of the NMOS driver transistors $1404_0$-$1404_3$ to a rail of a power supply (here, the $V_{DD}1$ rail 1408) during an ESD event. Each of the gates of the NMOS gate-pull transistors $1410_0$-$1410_3$ may be tied to an ESD control input 1412. The ESD control inputs 1412 may be provided to indicate ESD events and to trigger or enable one or more types of ESD protection circuits. Each of the ESD control inputs 1412 may be provided by the same ESD controller. In some examples, an ESD controller may be implemented in an ESD detection circuit used in ESD rail clamps, which are commonly found in ESD protection designs. In one example, the ESD control inputs 1412 can be derived from one or more of the ESD event indicator signals 236, 238 generated by the power rail clamping circuit 220 illustrated in FIG. 2.

During normal operation, the NMOS gate-pull transistors $1410_0$-$1410_3$ are turned off and maintained in an off state. A negative CDM-type ESD event causes the potential of the I/O pad 1402 to be raised to a higher voltage level than the $V_{DD}1$ rail 1408 and the $V_{DD}2$ rail and the NMOS gate-pull transistors $1410_0$-$1410_3$ are turned on reducing the voltage difference (|Vgd|) between the gates $1406_0$-$1406_3$ and the drains $1414_0$-$1414_3$.

Figure 15:
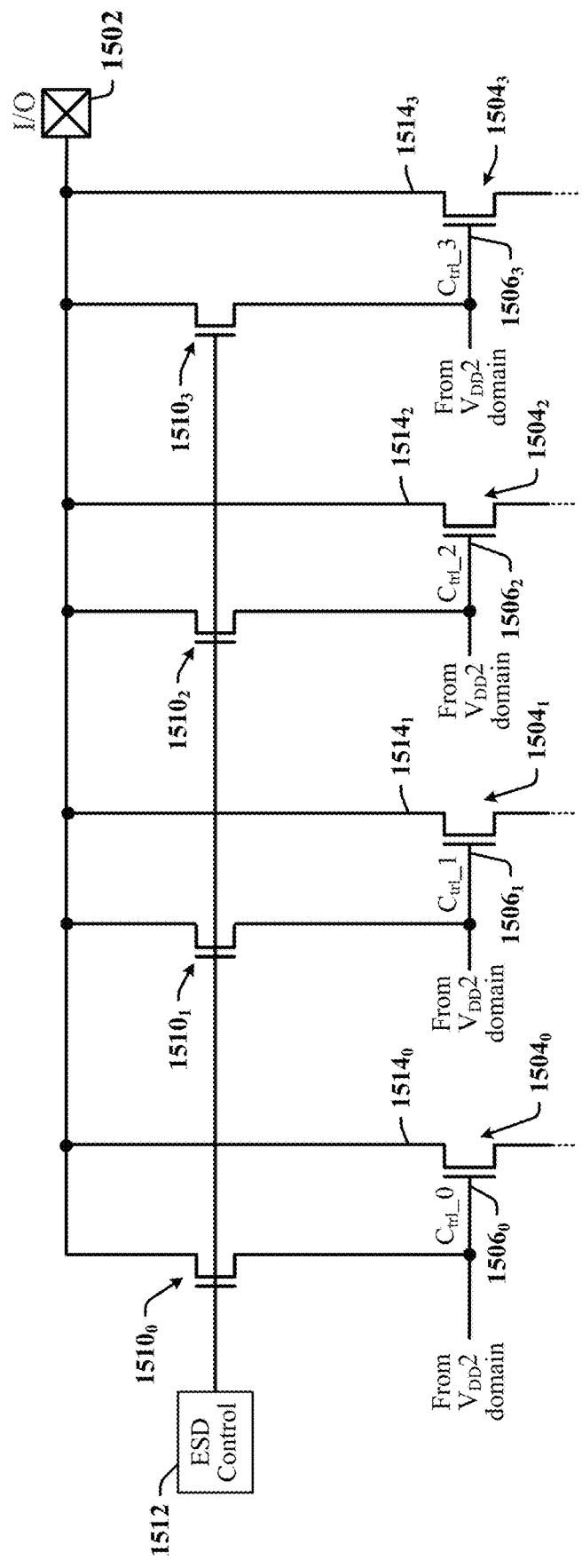
FIG. 15 relates to an interface circuit that includes NMOS gate-pull transistors coupled to an I/O pad and NMOS driver transistors in accordance with certain aspects of this disclosure.

FIG. 15 relates to an interface circuit 1500 in an IC device that includes NMOS driver transistors $1504_0$-$1504_3$ and NMOS gate-pull transistors $1510_0$-$1510_3$ configured in accordance with certain aspects of this disclosure. The NMOS gate-pull transistors $1510_0$-$1510_3$ may be coupled between the gates $1506_0$-$1506_3$ of the NMOS driver transistors $1504_0$-$1504_3$ and an I/O pad 1502. Each of the gates of the NMOS gate-pull transistors $1510_0$-$1510_3$ may be tied to an ESD control input 1512. The ESD control inputs 1512 may be provided to indicate ESD events and to trigger or enable one or more types of ESD protection circuits. The ESD control inputs 1512 may be provided by the same ESD controller. In one example, an ESD controller may be implemented in an ESD detection circuit used in ESD rail clamps, which are commonly found in ESD protection designs. The ESD control inputs 1512 can be derived from the same signal output by an ESD rail clamp.

During normal operation, the NMOS gate-pull transistors $1510_0$-$1510_3$ are turned off and maintained in an off state. A negative CDM-type ESD event causes the potential of the I/O pad 1502 to be raised higher voltage level than the $V_{DD}1$ rail and the $V_{DD}2$ rail, and the NMOS gate-pull transistors $1510_0$-$1510_3$ are turned on reducing the voltage difference (|Vgd|) between the gates $1506_0$-$1506_3$ and the drains $1514_0$-$1514_3$.

Each of the NMOS gate-pull transistors $1410_0$-$1410_3$, $1510_0$-$1510_3$ in the interface circuits 1400, 1500 is typically not matched with any other transistor in the interface circuit 1400, 1500 or elsewhere and can be implemented using spare or otherwise unused gates near the interface circuit 1400, 1500 within an IC. In one example, certain technologies or designs have unused transistors on two edges of a driver layout group for balancing purposes. In other examples, unused transistors may be present at or near the center of a driver layout group. The unused transistors may have an elongated physical shape and may be referred to as dummy fingers or dummy transistors. In some examples, unused transistors, which may also be referred to as unassigned transistors, may be provided in an area of the IC device to assist in preventing transistor performance mismatch due to layout dependent effects. The NMOS gate-pull transistors $1410_0$-$1410_3$, $1510_0$-$1510_3$ remain at high-impedance during normal operations and do not affect the operation of other IC circuits. Accordingly, it is possible to use one or more of these dummy transistors or unassigned transistors to implement NMOS gate-pull transistors $1410_0$-$1410_3$, $1510_0$-$1510_3$ for ESD protection purposes. The NMOS gate-pull transistors $1410_0$-$1410_3$, $1510_0$-$1510_3$ can be formed as thin gate oxide transistors or thick gate oxide transistors.

Figure 16:
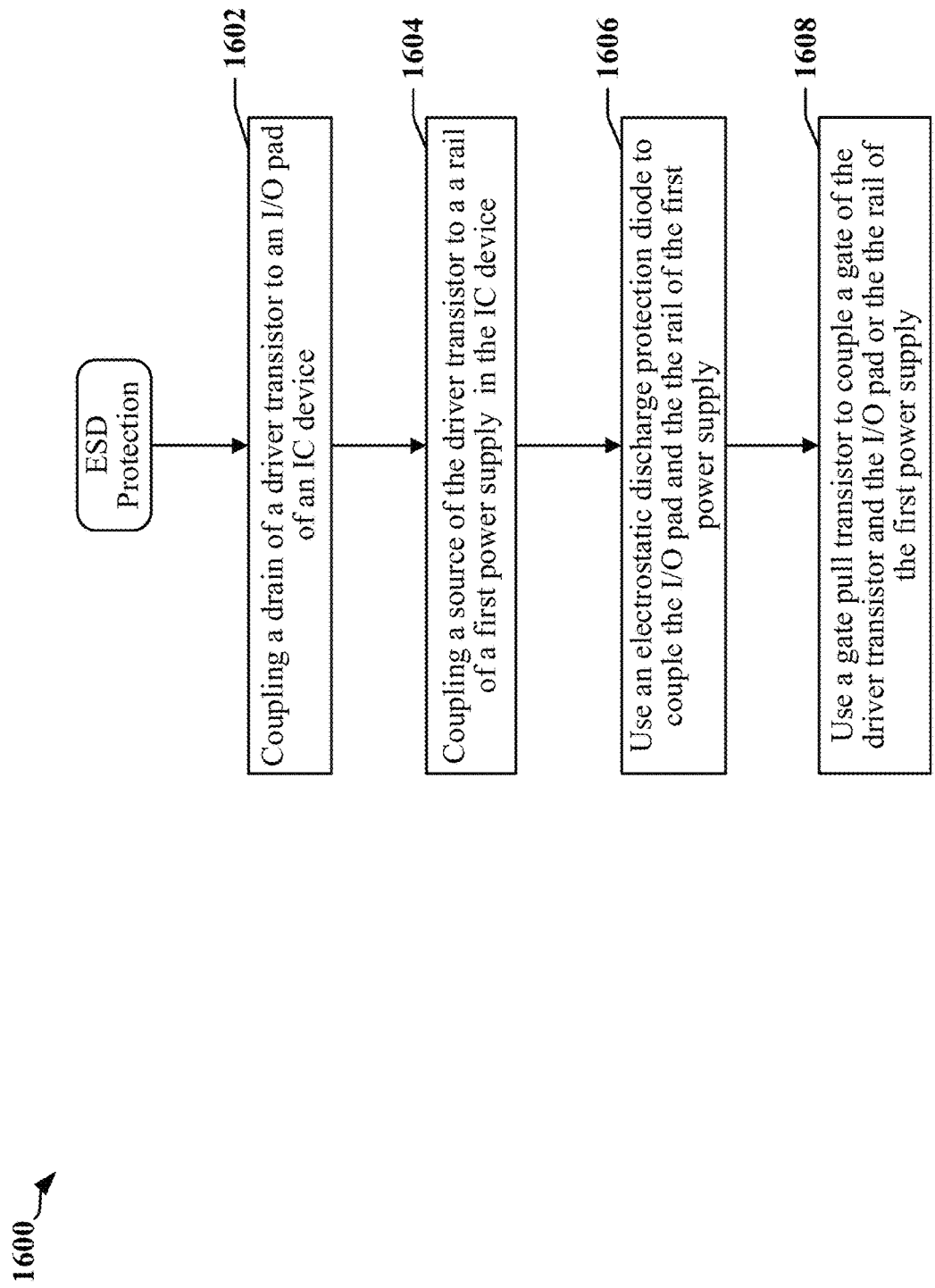
FIG. 16 is a flow diagram illustrating a method for providing ESD protection in accordance with certain aspects disclosed herein.

FIG. 16 is a flow diagram illustrating an example of a method 1600 for providing ESD protection in an IC device in accordance with certain aspects disclosed herein. The method may relate to various features and aspects of the ESD protection circuits illustrated in FIGS. 6-15. At block 1602, a drain of a driver transistor may be coupled to an I/O pad of the IC device. The driver transistor may be a PMOS or NMOS transistor.

At block 1604, a source of the driver transistor may be coupled to a rail of a first power supply in the IC device. In one example, the source of the driver transistor may be coupled to the rail of the first power supply through at least one other transistor. At block 1606, an electrostatic discharge protection diode may be used to couple the I/O pad and the rail of the first power supply. In some examples, the diode is reverse-biased when a rated voltage is applied to the I/O pad. The rated voltage may lie within a nominal operating range of voltage levels defined for the I/O pad. At block 1608, a gate pull transistor may be used to couple a gate of the driver transistor and the I/O pad or the rail of the first power supply.

In some examples, the driver transistor may be coupled to the rail of the first power supply through at least one other transistor. The gate of the driver transistor may be configured to receive an input signal provided by a pre-driver circuit operated in a voltage domain corresponding to a second power supply.

In some examples, a clamp circuit may be coupled between the rail of the first power supply and a ground reference rail of the first power supply. The clamp circuit may be configured to provide a control signal to a gate of the gate pull transistor.

In some examples, the gate pull transistor is a PMOS transistor that is configured to couple the gate of the driver transistor to the rail of the first power supply. A gate of the gate pull transistor may be coupled to a rail of a second power supply.

In some examples, the gate pull transistor is a PMOS transistor that is configured to couple the gate of the driver transistor to the I/O pad. In some instances, the gate of the gate pull transistor may be coupled to the rail of the first power supply. In some instances, the gate of the gate pull transistor may be coupled to a rail of a second power supply.

In some examples, the gate pull transistor is an NMOS transistor. In some examples, the gate pull transistor is configured to provide a low impedance path between the gate of the driver transistor and the I/O pad or to the rail of the first power supply during an electrostatic discharge event. In some examples, the driver transistor is a PMOS transistor. In some examples, the driver transistor is an NMOS transistor.

It is noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus performing certain functions disclosed herein may include means for driving an I/O pad of an IC device, means for diverting an ESD current received at the I/O pad to a rail of the first power supply during an ESD event, and means for pulling a gate of the driver transistor to a voltage level of the I/O pad or to the rail of the first power supply during the ESD event. The means for driving the I/O pad may include a driver transistor coupled by its source to the rail of a first power supply in the I/C device. The means for pulling the gate of the driver transistor may include a gate pull transistor coupled between the gate of the driver transistor and the I/O pad or the rail of the first power supply. In one example, the driver transistor is coupled to the rail of the first power supply through at least one other transistor. In certain examples, the gate of the driver transistor is configured to receive an input signal provided by a pre-driver circuit operated in a voltage domain corresponding to a second power supply.

In some examples, the apparatus includes means for clamping the rail of the first power supply. The means for clamping the rail of the first power supply may be implemented using a clamp circuit coupled between the rail of the first power supply and a ground reference rail of the first power supply. The means for clamping the rail of the first power supply is configured to provide a control signal to a gate of the gate pull transistor.

In some examples, the apparatus includes means for controlling the gate pull transistor when the gate pull transistor is a PMOS transistor that is configured to couple the gate of the driver transistor to the rail of the first power supply. The means for controlling the gate pull transistor may include a connector or resistance configured to couple a gate of the gate pull transistor to a rail of a second power supply.

In some examples, the apparatus includes means for controlling the gate pull transistor when the gate pull transistor is a PMOS transistor that is configured to couple the gate of the driver transistor to the I/O pad. In some instances, the means for controlling the gate pull transistor includes a connector or resistance configured to couple a gate of the gate pull transistor to the rail of the first power supply. In some instances, the means for controlling the gate pull transistor includes a connector or resistance configured to couple the gate of the gate pull transistor to a rail of a second power supply.

In one example, the gate pull transistor is configured to provide a low impedance path between the gate of the driver transistor and the I/O pad during the ESD event. In another example, the gate pull transistor is configured to provide a low impedance path between the gate of the driver transistor and the rail of the first power supply during the ESD event.

In certain examples, the means for diverting an electrostatic discharge current includes an ESD protection diode.

In one example, the gate pull transistor is implemented using a dummy transistor or an otherwise unassigned transistor within a driver layout in the IC device. In some examples, the gate pull transistor is an NMOS transistor. In some examples, the driver transistor is implemented using an NMOS transistor. In some examples, the driver transistor is implemented using a PMOS transistor.

In one example, an ESD protection circuit includes a driver transistor having a drain that is coupled to an I/O pad of an IC device and a source that is coupled to a rail of a first power supply in the IC device, an ESD diode that couples the I/O pad to the rail of the first power supply, and a gate pull transistor that couples a gate of the driver transistor to the I/O pad or to the rail of the first power supply.

In one example, the source of the driver transistor is coupled to the rail of the first power supply through at least one other transistor. In some instances, the gate of the driver transistor is configured to receive an input signal provided by a pre-driver circuit powered by a second power supply.

In some examples, the apparatus has a clamp circuit coupled between the rail of the first power supply and a ground reference rail of the first power supply. The clamp circuit may provide a control signal to a gate of the gate pull transistor.

In some examples, the gate pull transistor is a PMOS transistor that is configured to couple the gate of the driver transistor to the rail of the first power supply, and the gate of the gate pull transistor is coupled to a rail of a second power supply.

In some examples, the gate pull transistor is a PMOS transistor that is configured to couple the gate of the driver transistor to the I/O pad. The gate of the gate pull transistor may be coupled to the rail of the first power supply. The gate of the gate pull transistor may be coupled to a rail of a second power supply.

In certain examples, the gate pull transistor is configured to provide a low impedance path between the gate of the driver transistor and the I/O pad or the rail of the first power supply during an ESD event.

In some examples, the gate pull transistor is implemented using a dummy transistor within a driver layout in the integrated circuit device. In some examples, the gate pull transistor is implemented using an otherwise unassigned transistor within a driver layout in the integrated circuit device.

In some examples, the gate pull transistor is implemented using an NMOS transistor. In some examples, the driver transistor is implemented using a PMOS transistor. In some examples, the driver transistor is implemented using an NMOS transistor.

Some implementation examples are described in the following numbered clauses:

1. An electrostatic discharge protection circuit, comprising: a driver transistor having a drain that is coupled to an input/output pad of an integrated circuit device and a source that is coupled to a rail of a first power supply in the integrated circuit device; an electrostatic discharge protection diode that couples the input/output pad to the rail of the first power supply; and a gate pull transistor that couples a gate of the driver transistor to the input/output pad or to the rail of the first power supply.
2. The electrostatic discharge protection circuit as described in clause 1, wherein the source of the driver transistor is coupled to the rail of the first power supply through at least one other transistor.
3. The electrostatic discharge protection circuit as described in clause 1 or clause 2, wherein the gate of the driver transistor is configured to receive an input signal provided by a pre-driver circuit powered by a second power supply.
4. The electrostatic discharge protection circuit as described in any of clauses 1-5, further comprising: a clamp circuit coupled between the rail of the first power supply and a ground reference rail of the first power supply.
5. The electrostatic discharge protection circuit as described in clause 6, wherein the clamp circuit provides a control signal to a gate of the gate pull transistor.
6. The electrostatic discharge protection circuit as described in any of clauses 1-5, wherein: the gate pull transistor is a P-type metal-oxide-semiconductor transistor that is configured to couple the gate of the driver transistor to the rail of the first power supply; and the gate of the gate pull transistor is coupled to a rail of a second power supply.
7. The electrostatic discharge protection circuit as described in any of clauses 1-5, wherein: the gate pull transistor is a P-type metal-oxide-semiconductor transistor that is configured to couple the gate of the driver transistor to the input/output pad; and the gate of the gate pull transistor is coupled to the rail of the first power supply or to a rail of a second power supply.
8. The electrostatic discharge protection circuit as described in any of clauses 1-6, wherein the gate pull transistor comprises an N-type metal-oxide-semiconductor transistor.
9. The electrostatic discharge protection circuit as described in any of clauses 1-8, wherein the gate pull transistor is configured to provide a low impedance path between the gate of the driver transistor and the input/output pad or the rail of the first power supply during an electrostatic discharge event.
10. The electrostatic discharge protection circuit as described in any of clauses 1-9, wherein the gate pull transistor comprises an unassigned or dummy transistor within a driver layout in the integrated circuit device.
11. The electrostatic discharge protection circuit as described in any of clauses 1-10, wherein the driver transistor comprises a P-type metal-oxide-semiconductor transistor.
12. The electrostatic discharge protection circuit as described in any of clauses 1-10, wherein the driver transistor comprises an N-type metal-oxide-semiconductor transistor.
13. An apparatus, comprising: means for driving an input/output pad of an integrated circuit device, the means for driving the input/output pad including a driver transistor coupled by its source to a rail of a first power supply in the integrated circuit device; means for diverting an electrostatic discharge current received at the input/output pad to the rail of the first power supply during an electrostatic discharge event; and means for pulling a gate of the driver transistor to a voltage level of the input/output pad or to the rail of the first power supply during the electrostatic discharge event, the means for pulling the gate of the driver transistor comprising a gate pull transistor coupled between the gate of the driver transistor and the input/output pad or the rail of the first power supply.
14. The apparatus as described in clause 13, wherein the driver transistor is coupled to the rail of the first power supply through at least one other transistor.
15. The apparatus as described in clause 13 or claim 14, wherein the gate of the driver transistor is configured to receive an input signal provided by a pre-driver circuit operated in a voltage domain corresponding to a second power supply.
16. The apparatus as described in any of clauses 13-15, further comprising means for clamping the rail of the first power supply, including a clamp circuit coupled between the rail of the first power supply and a ground reference rail of the first power supply.
17. The apparatus as described in clause 16, wherein the means for clamping the rail of the first power supply is configured to provide a control signal to a gate of the gate pull transistor.
18. The apparatus as described in any of clauses 13-16, further comprising means for controlling the gate pull transistor, wherein the gate pull transistor is a P-type metal-oxide-semiconductor transistor that is configured to couple the gate of the driver transistor to the rail of the first power supply, and wherein the means for controlling the gate pull transistor includes a connector or resistance configured to couple a gate of the gate pull transistor to a rail of a second power supply.
19. The apparatus as described in any of clauses 13-16, further comprising means for controlling the gate pull transistor, wherein the gate pull transistor is a P-type metal-oxide-semiconductor transistor that is configured to couple the gate of the driver transistor to the input/output pad, and wherein the means for controlling the gate pull transistor includes a connector or resistance configured to couple a gate of the gate pull transistor to the rail of the first power supply or to a rail of a second power supply.
20. The apparatus as described in any of clauses 13-17, wherein the gate pull transistor comprises an N-type metal-oxide-semiconductor transistor.
21. The apparatus as described in any of clauses 13-20, wherein the gate pull transistor is configured to provide a low impedance path between the gate of the driver transistor and the input/output pad or to the rail of the first power supply during the electrostatic discharge event.

22. The apparatus as described in clause 21, wherein the means for diverting an electrostatic discharge current comprises an electrostatic discharge protection diode.

23. The apparatus as described in any of clauses 13-22, wherein the gate pull transistor comprises an unassigned or dummy transistor within a driver layout in the integrated circuit device.

24. The apparatus as described in any of clauses 13-23, wherein the driver transistor comprises an N-type metal-oxide-semiconductor transistor.

25. The apparatus as described in any of clauses 13-23, wherein the driver transistor comprises a P-type metal-oxide-semiconductor transistor.

26. A method for providing electrostatic discharge protection in an integrated circuit device, comprising: coupling a drain of a driver transistor to an input/output pad of the integrated circuit device; coupling a source of the driver transistor to a rail of a first power supply in the integrated circuit device; using an electrostatic discharge protection diode to couple the input/output pad and the rail of the first power supply; and using a gate pull transistor to couple a gate of the driver transistor and the input/output pad or the rail of the first power supply.

27. The method as described in clause 26, further comprising: coupling the driver transistor to the rail of the first power supply through at least one other transistor.

28. The method as described in clause 26 or clause 27, wherein the gate of the driver transistor is configured to receive an input signal provided by a pre-driver circuit operated in a voltage domain corresponding to a second power supply.

29. The method as described in any of clauses 26-28, coupling a clamp circuit between the rail of the first power supply and a ground reference rail of the first power supply.

30. The method as described in clause 29, wherein the clamp circuit is configured to provide a control signal to a gate of the gate pull transistor.

31. The method as described in any of clauses 26-29, wherein the gate pull transistor is a P-type metal-oxide-semiconductor transistor that is configured to couple the gate of the driver transistor to the rail of the first power supply, further comprising: coupling a gate of the gate pull transistor to a rail of a second power supply.

32. The method as described in any of clauses 26-29, wherein the gate pull transistor is a P-type metal-oxide-semiconductor transistor that is configured to couple the gate of the driver transistor to the input/output pad, further comprising: coupling the gate of the gate pull transistor to the rail of the first power supply or to a rail of a second power supply.

33. The method as described in any of clauses 26-30, wherein the gate pull transistor comprises an N-type metal-oxide-semiconductor transistor.

34. The method as described in any of clauses 26-33, further comprising: configuring the gate pull transistor to provide a low impedance path between the gate of the driver transistor and the input/output pad or to the rail of the first power supply during an electrostatic discharge event.

35. The method as described in any of clauses 26-34, wherein the driver transistor comprises a P-type metal-oxide-semiconductor transistor.

36. The method as described in any of clauses 26-35, wherein the driver transistor comprises an N-type metal-oxide-semiconductor transistor.

37. The electrostatic discharge protection circuit as described in any of clauses 1-12, the apparatus as described in any of clauses 13-25, or the method as described in any of clauses 26-36, wherein a drain of the gate pull transistor is coupled to the gate of the driver transistor and a source of the gate pull transistor is coupled to the input/output pad or to the rail of the first power supply.

38. The electrostatic discharge protection circuit as described in any of clauses 1-12 or the method as described in any of clauses 26-36, wherein the electrostatic discharge protection diode is configured to be forward-biased during an electrostatic discharge event and reverse-biased before occurrence of the electrostatic discharge event.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An electrostatic discharge protection circuit in an integrated circuit device, comprising:
   a driver transistor having a drain that is coupled to an input/output pad of the integrated circuit device and a source that is coupled to a rail of a first power supply in the integrated circuit device through at least one other transistor;
   an electrostatic discharge protection diode that couples the input/output pad to the rail of the first power supply; and
   a gate pull transistor that couples a gate of the driver transistor to the input/output pad or to the rail of the first power supply.

2. The electrostatic discharge protection circuit of claim 1, wherein the gate of the driver transistor is configured to receive an input signal provided by a pre-driver circuit powered by a second power supply.

3. The electrostatic discharge protection circuit of claim 1, further comprising:
   a clamp circuit coupled between the rail of the first power supply and a ground reference rail of the first power supply.

4. The electrostatic discharge protection circuit of claim 3, wherein the clamp circuit provides a control signal to a gate of the gate pull transistor.

5. The electrostatic discharge protection circuit of claim 1, wherein:
the gate pull transistor is a P-type metal-oxide-semiconductor transistor that is configured to couple the gate of the driver transistor to the rail of the first power supply; and
the gate of the gate pull transistor is coupled to a rail of a second power supply.

6. The electrostatic discharge protection circuit of claim 1, wherein:
the gate pull transistor is a P-type metal-oxide-semiconductor transistor that is configured to couple the gate of the driver transistor to the input/output pad; and
the gate of the gate pull transistor is coupled to the rail of the first power supply or to a rail of a second power supply.

7. The electrostatic discharge protection circuit of claim 1, wherein the gate pull transistor comprises an N-type metal-oxide-semiconductor transistor.

8. The electrostatic discharge protection circuit of claim 1, wherein the gate pull transistor is configured to provide a low impedance path between the gate of the driver transistor and the input/output pad or the rail of the first power supply during an electrostatic discharge event.

9. The electrostatic discharge protection circuit of claim 1, wherein the gate pull transistor comprises an unassigned or dummy transistor within a driver layout in the integrated circuit device.

10. The electrostatic discharge protection circuit of claim 1, wherein the driver transistor comprises a P-type metal-oxide-semiconductor transistor.

11. The electrostatic discharge protection circuit of claim 1, wherein the driver transistor comprises an N-type metal-oxide-semiconductor transistor.

12. An apparatus, comprising:
means for driving an input/output pad of an integrated circuit device, the means for driving the input/output pad including a driver transistor coupled by its source to a rail of a first power supply in the integrated circuit device through at least one other transistor;
means for diverting an electrostatic discharge current received at the input/output pad to the rail of the first power supply during an electrostatic discharge event; and
means for pulling a gate of the driver transistor to a voltage level of the input/output pad or to the rail of the first power supply during the electrostatic discharge event, the means for pulling the gate of the driver transistor comprising a gate pull transistor coupled between the gate of the driver transistor and the input/output pad or the rail of the first power supply.

13. The apparatus of claim 12, wherein the gate of the driver transistor is configured to receive an input signal provided by a pre-driver circuit operated in a voltage domain corresponding to a second power supply.

14. The apparatus of claim 12, further comprising:
means for clamping the rail of the first power supply, including a clamp circuit coupled between the rail of the first power supply and a ground reference rail of the first power supply.

15. The apparatus of claim 14, wherein the means for clamping the rail of the first power supply is configured to provide a control signal to a gate of the gate pull transistor.

16. The apparatus of claim 12, further comprising:
means for controlling the gate pull transistor, wherein the gate pull transistor is a P-type metal-oxide-semiconductor transistor that is configured to couple the gate of the driver transistor to the rail of the first power supply, and wherein the means for controlling the gate pull transistor includes a connector or resistance configured to couple a gate of the gate pull transistor to a rail of a second power supply.

17. The apparatus of claim 12, further comprising:
means for controlling the gate pull transistor, wherein the gate pull transistor is a P-type metal-oxide-semiconductor transistor that is configured to couple the gate of the driver transistor to the input/output pad, and wherein the means for controlling the gate pull transistor includes a connector or resistance configured to couple a gate of the gate pull transistor to the rail of the first power supply or to a rail of a second power supply.

18. The apparatus of claim 12, wherein the gate pull transistor comprises an N-type metal-oxide-semiconductor transistor.

19. The apparatus of claim 12, wherein the gate pull transistor is configured to provide a low impedance path between the gate of the driver transistor and the input/output pad or to the rail of the first power supply during the electrostatic discharge event.

20. The apparatus of claim 19, wherein the means for diverting an electrostatic discharge current comprises an electrostatic discharge protection diode.

21. The apparatus of claim 12, wherein the gate pull transistor comprises an unassigned or dummy transistor within a driver layout in the integrated circuit device.

22. The apparatus of claim 12, wherein the driver transistor comprises an N-type metal-oxide-semiconductor transistor.

23. The apparatus of claim 12, wherein the driver transistor comprises a P-type metal-oxide-semiconductor transistor.

24. A method for providing electrostatic discharge protection in an integrated circuit device, comprising:
coupling a drain of a driver transistor to an input/output pad of the integrated circuit device;
coupling a source of the driver transistor to a rail of a first power supply in the integrated circuit device through at least one other transistor;
using an electrostatic discharge protection diode to couple the input/output pad and the rail of the first power supply; and
using a gate pull transistor to couple a gate of the driver transistor and the input/output pad or the rail of the first power supply.

25. The method of claim 24, wherein the gate of the driver transistor is configured to receive an input signal provided by a pre-driver circuit operated in a voltage domain corresponding to a second power supply.

26. The method of claim 24, further comprising:
coupling a clamp circuit between the rail of the first power supply and a ground reference rail of the first power supply.

27. The method of claim 26, wherein the clamp circuit is configured to provide a control signal to a gate of the gate pull transistor.

28. The method of claim 24, wherein the gate pull transistor is a P-type metal-oxide-semiconductor transistor that is configured to couple the gate of the driver transistor to the rail of the first power supply, further comprising:
coupling a gate of the gate pull transistor to a rail of a second power supply.

29. The method of claim 24, wherein the gate pull transistor is a P-type metal-oxide-semiconductor transistor that is configured to couple the gate of the driver transistor to the input/output pad, further comprising:
    coupling the gate of the gate pull transistor to the rail of the first power supply or to a rail of a second power supply.

30. The method of claim 24, wherein the gate pull transistor comprises an N-type metal-oxide-semiconductor transistor.

31. The method of claim 24, further comprising:
    configuring the gate pull transistor to provide a low impedance path between the gate of the driver transistor and the input/output pad or to the rail of the first power supply during an electrostatic discharge event.

32. The method of claim 24, wherein the driver transistor comprises a P-type metal-oxide-semiconductor transistor.

33. The method of claim 24, wherein the driver transistor comprises an N-type metal-oxide-semiconductor transistor.

\* \* \* \* \*